(12) United States Patent
Vadhavkar et al.

(10) Patent No.: US 12,677,666 B2
(45) Date of Patent: Jul. 7, 2026

(54) DIE EDGE PROTECTION TO ELIMINATE DIE CHIPPING

(71) Applicant: QUALCOMM Incorporated, San Diego, CA (US)

(72) Inventors: Sameer Sunil Vadhavkar, San Diego, CA (US); Changhan Hobie Yun, San Diego, CA (US); Paragkumar Ajaybhai Thadesar, San Diego, CA (US); Nosun Park, Incheon (KR); Daniel Daeik Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 835 days.

(21) Appl. No.: 17/661,029

(22) Filed: Apr. 27, 2022

(65) Prior Publication Data

US 2023/0352423 A1     Nov. 2, 2023

(51) Int. Cl.
*H10W 42/00*     (2026.01)

(52) U.S. Cl.
CPC ................................. *H10W 42/121* (2026.01)

(58) Field of Classification Search
CPC .............. H01L 23/562; H01L 23/3128; H01L 23/3171; H01L 23/3185; H10W 42/121; H10W 74/117; H10W 74/137; H10W 42/141
See application file for complete search history.

(56) References Cited

U.S. PATENT DOCUMENTS

| | | | | |
|---|---|---|---|---|
| 9,892,989 B1 * | 2/2018 | Ho | ..................... | H10W 72/90 |
| 12,228,776 B2 * | 2/2025 | Yu | ..................... | G02B 6/4206 |
| 2005/0253273 A1 * | 11/2005 | Tai | .................... | H10W 70/09 |
| | | | | 257/E23.177 |
| 2006/0068567 A1 * | 3/2006 | Beyne | .................. | H01L 21/78 |
| | | | | 438/460 |
| 2008/0197474 A1 * | 8/2008 | Yang | ..................... | H01L 24/97 |
| | | | | 257/690 |
| 2008/0197478 A1 * | 8/2008 | Yang | .................... | H01L 21/568 |
| | | | | 438/119 |
| 2008/0230884 A1 * | 9/2008 | Yang | .................. | H01L 25/0655 |
| | | | | 257/784 |
| 2012/0112336 A1 * | 5/2012 | Guzek | ................ | H10W 74/129 |
| | | | | 257/E21.575 |
| 2015/0008597 A1 * | 1/2015 | Lin | ................... | H01L 21/76802 |
| | | | | 257/787 |
| 2016/0204074 A1 * | 7/2016 | Lin | ..................... | H01L 21/784 |
| | | | | 257/76 |
| 2016/0231604 A1 * | 8/2016 | Lin | ................... | G02F 1/136277 |
| 2017/0077007 A1 * | 3/2017 | Suthiwongsunthorn | ..................... | |
| | | | | H01L 21/3105 |
| 2018/0090247 A1 * | 3/2018 | Matsumoto | ............ | H01C 1/148 |
| 2018/0226543 A1 * | 8/2018 | Masui | ................. | H10H 20/819 |
| 2018/0294202 A1 * | 10/2018 | Cheng | ................. | H10W 74/121 |

(Continued)

OTHER PUBLICATIONS

International Search Report and Written Opinion—PCT/US2023/063196—ISA/EPO—Jun. 20, 2023.

*Primary Examiner* — Ida M Soward

(74) *Attorney, Agent, or Firm* — MG-IP/Qualcomm

(57)     ABSTRACT

Disclosed is a device that includes a die and a protection layer surrounding the die. The protection layer is applied at a backend process prior to dicing a wafer to individual dies. The protection layer protects the die from chips and cracks during and after dicing the wafer.

14 Claims, 23 Drawing Sheets

(56)           References Cited

U.S. PATENT DOCUMENTS

| | | | |
|---|---|---|---|
| 2019/0035686 A1* | 1/2019 | Lu | H01L 23/538 |
| 2019/0229069 A1 | 7/2019 | Shikauchi et al. | |
| 2020/0258751 A1 | 8/2020 | Seddon et al. | |
| 2020/0402960 A1* | 12/2020 | Chen | H01L 23/3121 |
| 2021/0098328 A1* | 4/2021 | Chu | H01L 27/14636 |
| 2021/0143108 A1* | 5/2021 | Gruber | H01L 21/78 |
| 2021/0391216 A1 | 12/2021 | Yang | |
| 2021/0391322 A1* | 12/2021 | Chen | H01L 21/78 |
| 2022/0068736 A1* | 3/2022 | Lo | H01L 24/81 |
| 2022/0254673 A1* | 8/2022 | Min | H01L 25/0753 |
| 2023/0187299 A1* | 6/2023 | Mao | H01L 21/78 |
| | | | 257/737 |

* cited by examiner

CONVENTIONAL ART

200

210

W(s)

T(w)

215

200

210

W(s)

T(d)

215

200

210

400

410

420,
422

400

410

420,
422

1400

Provide a die — 1410

Form a protection layer on sidewalls of the die, the protection layer surrounding all sidewalls of the die — 1420

1704

1702

1700

1700

1700

1706

DIE EDGE PROTECTION TO ELIMINATE DIE CHIPPING

FIELD OF DISCLOSURE

This disclosure relates generally to semiconductor devices or dies, and more specifically, but not exclusively, to protecting the devices or dies to reduce or even eliminate chipping and fabrication techniques thereof.

BACKGROUND

When a wafer (e.g., silicon (Si), gallium arsenide (GaAs), gallium nitride (GaN), etc.) is diced into individual dies, chipping and/or cracking are big issues. Various dicing techniques—e.g., mechanical, laser, stealth, plasma, etc.—to singulate or dice the wafer into individual dies have process variations. These variations create frontside and/or backside chipping in dies.

Such chipping/cracking results in lowering the yield of useful dies. Accordingly, there is a need for systems, apparatus, and methods that address the chipping and cracking issues when singulating or dicing the wafer into individual dies including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary device is disclosed. The device may comprise a die. The device may also comprise a protection layer formed on sidewalls of the die. The protection layer may surround all sidewalls of the die.

A method of fabricating a device is disclosed. The method may comprise providing a die. The method may also comprise forming a protection layer on sidewalls of the die. The protection layer may surround all sidewalls of the die.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
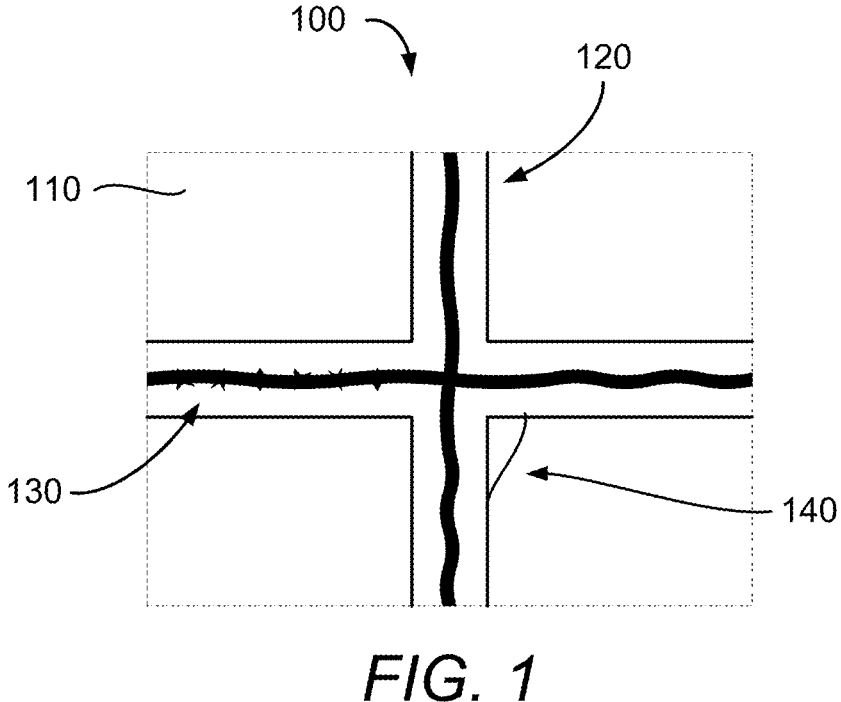
FIG. 1 illustrates one or more issues associated with dicing a wafer into individual dies.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, backend processes to singulate/dice a wafer into individual dies or chips create significant weaknesses in the die edge, which in turn pose real risks such as reducing the yield of workable dies. Such risks appear to be present regardless of the technology of the dies, e.g., silicon (Si), gallium arsenide (GaAs), gallium nitride (GaN), etc. The risks also appear to be present regardless of the dicing techniques used, e.g., mechanical, laser, stealth, plasma, etc. This is because there are process variations in all dicing techniques. For example, when using a mechanical dicing technique, the dicing blade can meander and/or vibrate from the desired dicing line. As a result, chips and/or cracks may develop on front and/or backside of the die. In particular, the edge sidewalls of the die can suffer from chips and cracks.

The chipping and/or cracking may make the die unusable resulting in lowering of the die yield from the wafer. Also, even if the die is initially usable, the chipping and/or cracking may propagate into the interior of the die when in use as it undergoes thermal expansion and contraction as it is turned on and off repeatedly.

FIG. 1 illustrates one or more issues associated with dicing a wafer into individual dies. FIG. 1 illustrates a wafer 100 with partial views of four dies or chips 110 with edges 120. The wafer 100 is assumed to be diced along dice lines 130. Variations in the dicing process can result in meandering of the dice line 130. This in turn can lead to chips and cracks. More seriously, defects such as a crack/chip 140 can even develop within a die 110.

Figure 2A:
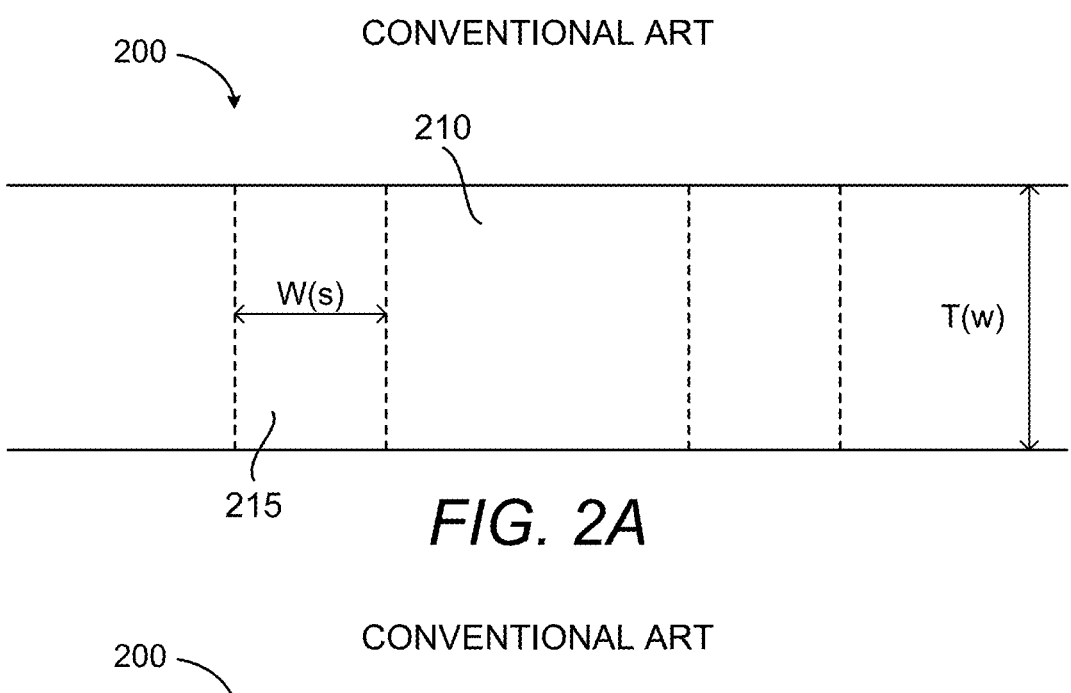
FIGS. 2A-2C illustrate stages of a conventional technique to dice a wafer.
Figure 2B:
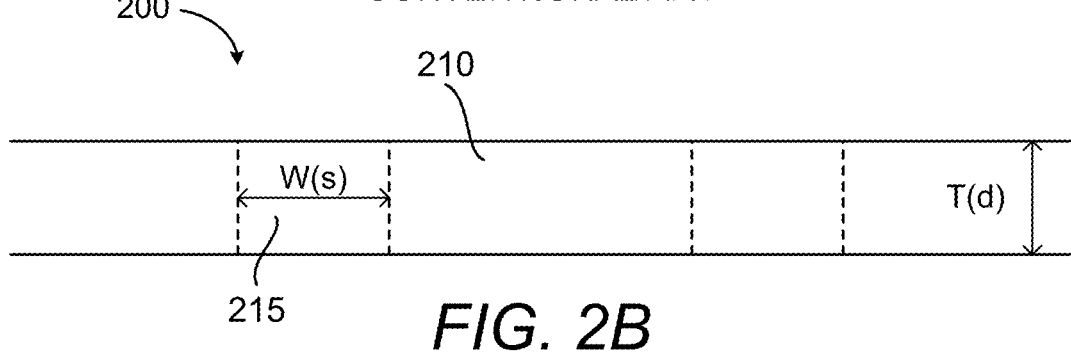
Figure 2C:
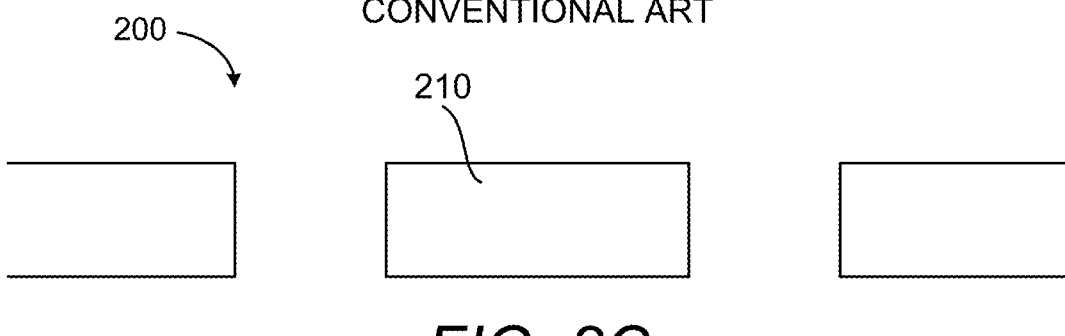

FIGS. 2A-2C illustrate stages of a conventional technique to dice a wafer into individual dies. FIG. 2A represents a result of frontend processing in which a wafer 200 comprising a plurality of dies 210 is produced. Between adjacent dies is a scribe region 215. A thickness of the wafer 200 is denoted as T(w) and a width of the scribe region 215 is denoted as W(s).

FIG. 2B illustrates a stage after backgrinding the wafer 200 to a thickness T(d), which is a thickness of the dies 210. FIG. 2C illustrate stage after the wafer 200 is diced into individual dies by dicing the scribe regions 215. When the wafer 200 is thinned by the backgrinding before dicing, there is a greater likelihood of chips and cracks developing by the dicing process as mentioned above. Edges and corners of the die 210 are particularly vulnerable for developing chips and cracks.

To address such issues, it is proposed to protect the die with a protection layer applied to the sidewalls of the die prior to dicing the wafer into individual dies. The protection layer may be applied as a part of a backend process. In general, the protection layer may be applied. Thereafter, the wafer may be diced into individual dies.

Figure 3A:
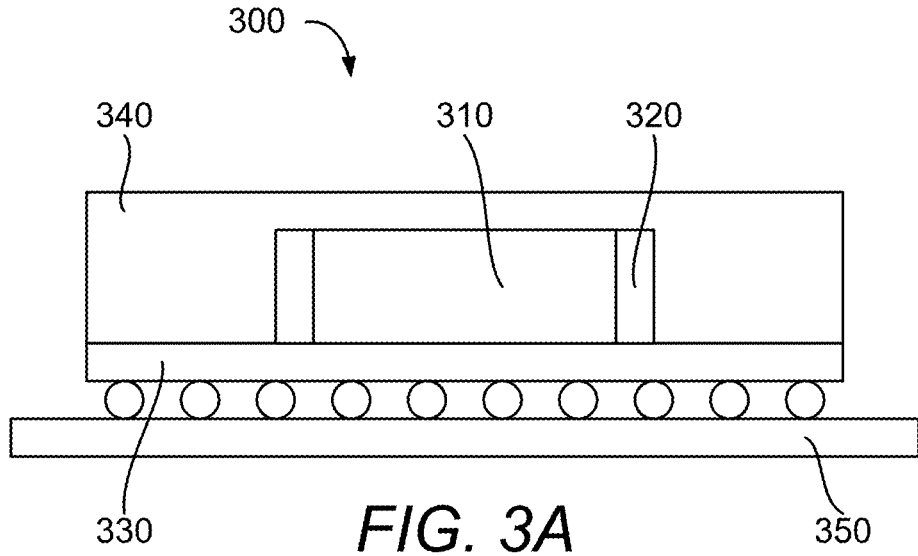
FIGS. 3A and 3B illustrate side and top views of an example module or a device in accordance with one or more aspects of the disclosure.
Figure 3B:
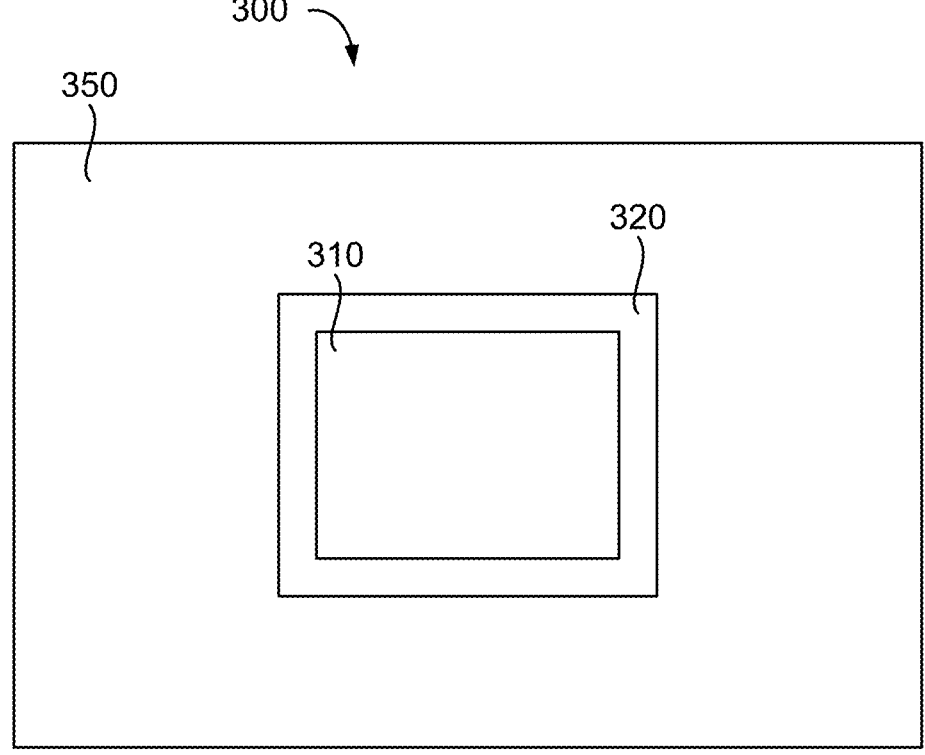

FIGS. 3A and 3B illustrate side and top views of an example module or a device 300 that has been protected with a protection layer 320 in accordance with one or more aspects of the disclosure. FIG. 3A illustrates a side view and FIG. 3B illustrates a top view of the device 300 with the die 310. As seen in FIG. 3A, the device 300 may include the die 310 on a substrate 330 and encapsulated with a mold compound 340. The die 310 may be connected to a board 350, such as a printed circuit board (PCB). The protection layer 320 may be formed on the sidewalls of the die 310. As seen in FIG. 3B, the protection layer 320 may be formed on all sidewalls of the die 310. That is, the protection layer may surround all sidewalls of the die 310.

The protection layer 320 may be formed from one or more passivation materials (e.g., oxides, nitrides, etc.) or one or more metals (e.g., titanium (Ti), chromium (Cr), gold (Au), etc.) or any combination thereof. In an aspect, the protection layer 320 may be formed from a material that is less brittle than the material of the die 310. In particular, protection layer 320 may be formed from a material that is less brittle than the material of an edge portion of the die 310. For example, the protection layer 320 may be formed from material less brittle than Si, GaAs, GaN, etc.

Figure 4A:
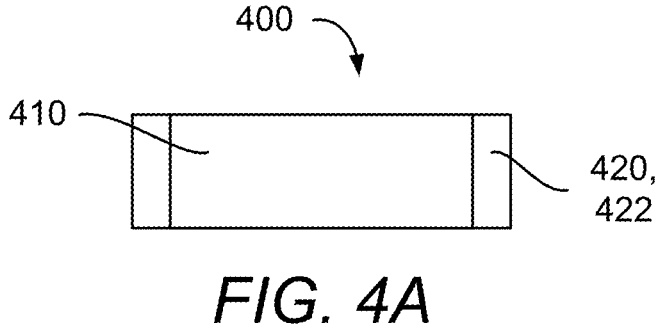
FIGS. 4A and 4B illustrate a device comprising a die and a protection layer in accordance with one or more aspects of the disclosure.
Figure 4B:
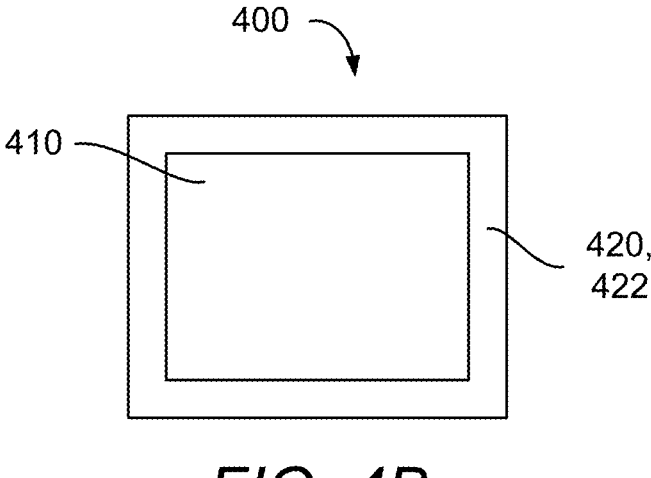

FIGS. 4A and 4B illustrate a device 400 in accordance with one or more aspects of the disclosure. FIGS. 4A and 4B illustrate side and top views of the device 400, respectively. As seen, the device 400 may comprise a die 410 and a protection layer 420. The die 410 may be assumed to be one of a plurality of dies of a wafer that have been diced into individual dies.

The protection layer 420 may comprise a sidewall protection layer 422. As seen in FIG. 4A, the sidewall protection layer 422 (and hence the protection layer 420) may be formed on the sidewalls of the die 410. As seen in FIG. 4B, sidewall protection layer 422 may surround all sidewalls of the die 410. The protection layer 420 including the sidewall protection layer 422 may be formed from materials similar to the protection layer 320 (e.g., passivation materials metals, etc.), and thus may possess similar characteristics (e.g., less brittle than the materials of the die 410).

In an aspect, the sidewall protection layer 422 may cover an entirety of a vertical height of the sidewalls of the die 410. That is, all sidewalls of the die 410 may be covered by the sidewall protection layer 422. In another aspect, an upper surface of the die 410 and an upper surface of the sidewall protection layer 422 may be planar with each other. Alternatively or in addition thereto, a lower surface of the die 410 and a lower surface of the sidewall protection layer 422 may be planar with each other.

Figure 5A:
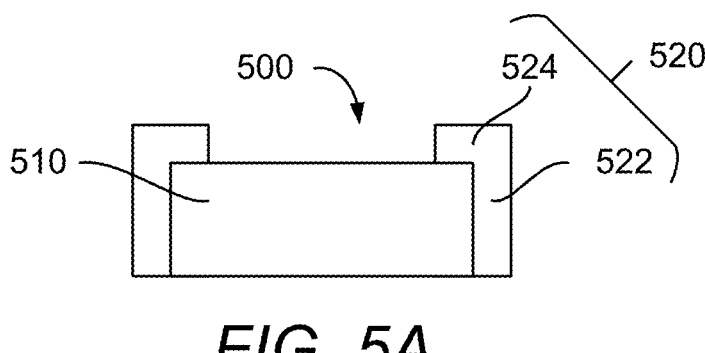
FIGS. 5A-5C illustrate a device comprising a die and a protection layer in accordance with one or more aspects of the disclosure.
Figure 5B:
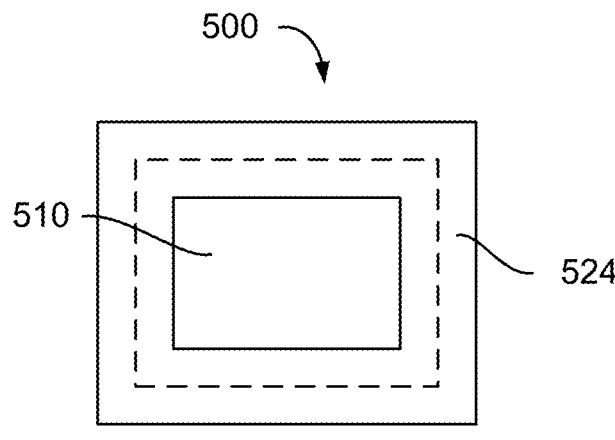
Figure 5C:
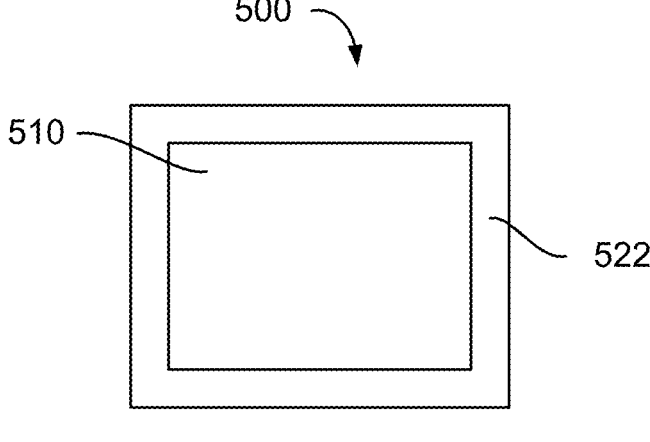

FIGS. 5A, 5B and 5C illustrate a device 500 in accordance with one or more aspects of the disclosure. FIG. 5A illustrates a side view, FIG. 5B illustrates a top view, and FIG. 5C illustrates a bottom view of the device 500. As seen, the device 500 may comprise a die 510 and a protection layer 520. The die 510 may be assumed to be one of a plurality of dies of a wafer that have been diced into individual dies.

The protection layer 520 may comprise a sidewall protection layer 522 and an upper edge protection layer 524. As seen in FIG. 5A, the sidewall protection layer 522 may be formed on the sidewalls of the die 510. The sidewall protection layer 522 may surround all sidewalls of the die 510. As seen in FIGS. 5A and 5B, the upper edge protection layer 524 may be formed on more upper edge portions of the die 510 and on an upper surface of the sidewall protection layer 522. In FIG. 5B, the dashed rectangle represents upper edges and corners of the die 510. The upper edge protection layer 524 may be formed on all upper edge portions of the die 510. As a result, all upper edges and corners of the die 510 may be covered by the protection layer 520, i.e., covered by the sidewall protection layer 522 and the upper edge protection layer 524.

In an aspect, the sidewall protection layer 522 and the upper edge protection layer 524 may be integrally formed from a same material. Alternatively, they may be formed from different materials. The protection layer 520 (i.e., the sidewall protection layer 522 and the upper edge protection layer 524) may be formed from materials similar to the protection layer 320 (e.g., passivation materials metals, etc.), and thus may possess similar characteristics (e.g., less brittle than the materials of the die 510).

In an aspect, the protection layer 520 may cover an entirety of a vertical height of the sidewalls of the die 510 as well as the upper edge portions of the die 510. In another aspect, a lower surface of the die 510 and a lower surface of the protection layer 520 may be planar with each other.

Figure 6A:
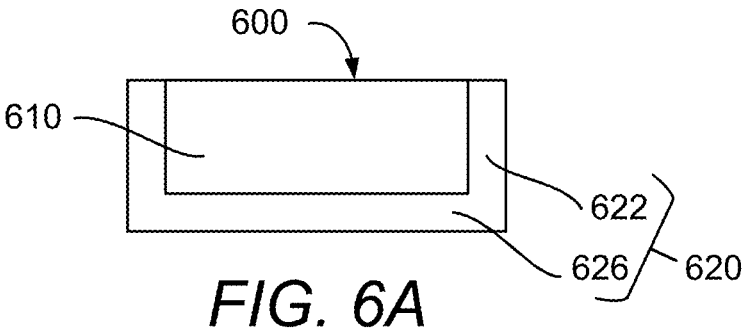
FIGS. 6A-6C illustrate a device comprising a die and a protection layer in accordance with one or more aspects of the disclosure.
Figure 6B:
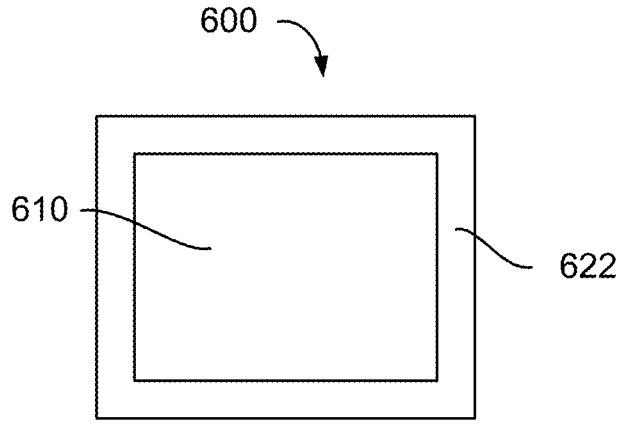
Figure 6C:
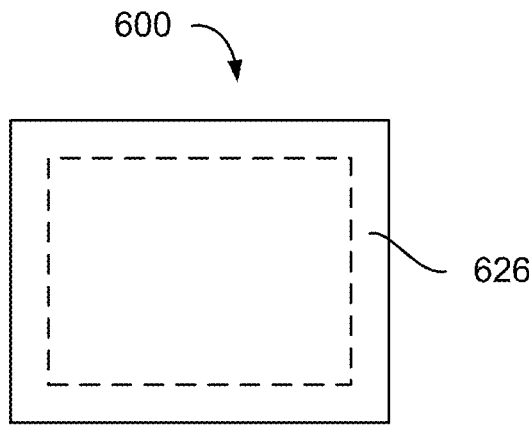

FIGS. 6A, 6B and 6C illustrate a device 600 in accordance with one or more aspects of the disclosure. FIG. 6A illustrates a side view, FIG. 6B illustrates a top view, and FIG. 6C illustrates a bottom view of the device 600. As seen, the device 600 may comprise a die 610 and a protection layer 620. The die 610 may be assumed to be one of a plurality of dies of a wafer that have been diced into individual dies.

The protection layer 620 may comprise a sidewall protection layer 622 and a lower surface protection layer 626. As seen in FIG. 6A, the sidewall protection layer 622 may be formed on the sidewalls of the die 610. As seen in FIGS. 6A and 6B, the sidewall protection layer 622 may surround all sidewalls of the die 610. As seen in FIGS. 6A and 6C, the lower surface protection layer 626 may be formed on a lower surface of the die 610 and on a lower surface of the sidewall protection layer 622. The dashed rectangle in FIG. 6C lower edges and corners of the die 610. In an aspect, the lower surface protection layer 626 may cover an entirety of the lower surface of the die 610. As a result, all lower edges and lower corners of the die 610 may be covered by the protection layer 620, i.e., covered by the sidewall protection layer 622 and the lower surface protection layer 626.

In an aspect, the sidewall protection layer 622 and the lower surface protection layer 626 may be formed from a same material. Alternatively, they may be formed from different materials. In an aspect, the lower surface protection layer 626 may be formed from one or more metals (e.g., Cu, Al, Ti, Au, etc.) and configured as a back via contact for the die 610. The die 610 may be a wirebond die or flip-chip die. The protection layer 620 (i.e., the sidewall protection layer 622 and the lower surface protection layer 626) may be formed from materials similar to the protection layer 320 (e.g., passivation materials metals, etc.), and thus may possess similar characteristics (e.g., less brittle than the materials of the die 610).

In an aspect, the protection layer 620 may cover an entirety of a vertical height of the sidewalls of the die 610. In another aspect, an upper surface of the die 610 and an upper surface of the protection layer 620 may be planar with each other. In an alternative aspect, an upper edge protection layer (similar to the upper edge protection layer 524) may be added (not shown). In this way, the upper edges and corners of the die 610 may also be covered, e.g., by the sidewall protection layer and the upper edge protection layer.

Figure 7A:
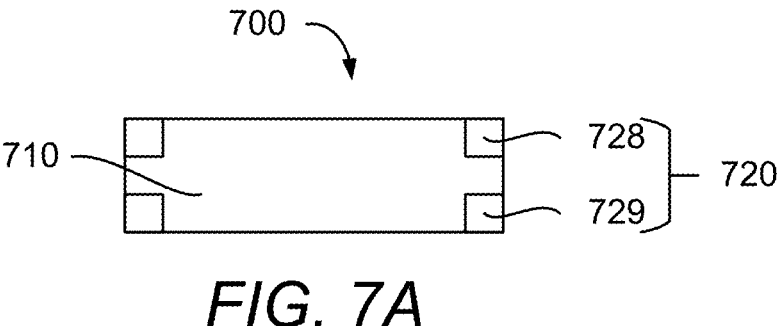
FIGS. 7A-7C illustrate a device comprising a die and a protection layer in accordance with one or more aspects of the disclosure.
Figure 7B:
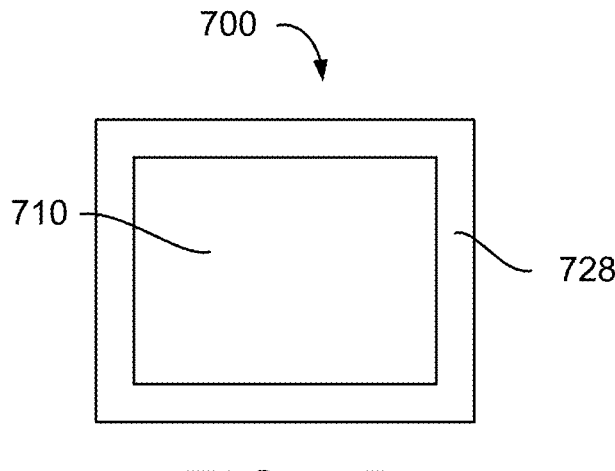
Figure 7C:
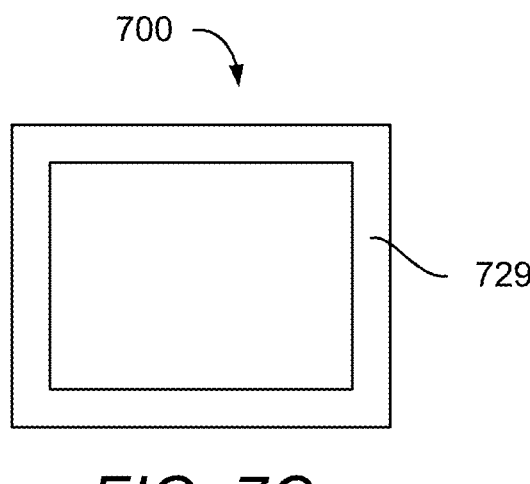

FIGS. 7A, 7B and 7C illustrate a device 700 in accordance with one or more aspects of the disclosure. FIG. 7A illustrates a side view, FIG. 7B illustrates a top view, and FIG. 7C illustrates a bottom view of the device 700. As seen, the device 700 may comprise a die 710 and a protection layer 720. The die 710 may be assumed to be one of a plurality of dies of a wafer that have been diced into individual dies.

As seen in FIG. 7A, the protection layer 720 may comprise an upper sidewall protection layer 728 and a lower sidewall protection layer 729. As seen in FIG. 7B, the upper sidewall protection layer 728 may surround upper portions of all sidewalls of the die 710. As seen in FIG. 7C, the lower sidewall protection layer 729 may surround lower portions of all sidewalls of the die 710. In an aspect, the upper and lower sidewall protection layers 728, 729 may be formed from a same material. Alternatively, they may be formed from different materials. The protection layer 720 (i.e., the upper and lower sidewall protection layers 728, 729) may be formed from materials similar to the protection layer 320 (e.g., passivation materials metals, etc.), and thus may possess similar characteristics (e.g., less brittle than the materials of the die 710).

In an aspect, the upper surface of the upper sidewall protection layer 728 may be planar with the upper surface of the die 710. Alternatively or in addition thereto, the lower surface of the lower sidewall protection layer 729 may be planar with the lower surface of the die 710. In an alternative aspect, an upper edge protection layer (similar to the upper edge protection layer 524) may be added (not shown). In this way, the upper edges and corners of the die 710 may be covered, e.g., by the upper sidewall protection layer and the upper edge protection layer. In another alternative aspect, a lower surface protection layer (similar to the lower surface protection layer 626) may be added (not shown). In this way, the lower edges and corners of the die 710 may be covered, by the lower sidewall protection layer and the lower edge protection layer. Both alternatives may be combined. That is, in yet another alternative, both upper edge protection layer and the lower surface protection layer may be added.

FIGS. 8A-8E illustrate stages of fabricating a device in accordance with one or more aspects of the disclosure. In an aspect, the fabricated device may be similar the device 400 comprising the die 410 with the protection layer 420 (including sidewall protection layer 422) illustrated in FIGS. 4A-4B.

Figure 8A:
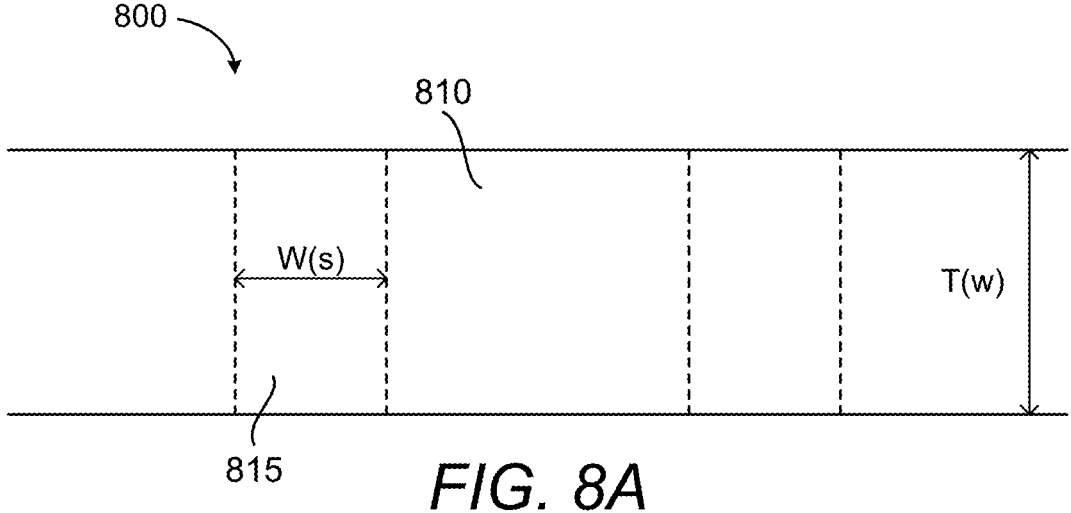
FIGS. 8A-8E illustrate stages of fabricating a device in accordance with one or more aspects of the disclosure.

FIG. 8A illustrates a stage after the frontend processing in which a wafer 800 comprising a plurality of dies 810 may be produced. The dies 810 may be semiconductor dies (e.g., Si, GaAs, GaN, etc.). T(w) represents the thickness of the wafer 800. For example, T(w) may be about 700 μm. Scribe regions 815 may be between adjacent dies 810 in the wafer 800. W(s) represents the width of the scribe region 815. T(w) may depend on the technology of the die 810 (e.g., Si, GaAs, GaN, etc.) and/or the dicing technology used to dice the wafer 800. In one example, T(w) may be about as small as 20 μm or as much as 45 μm or greater.

Figure 8B:
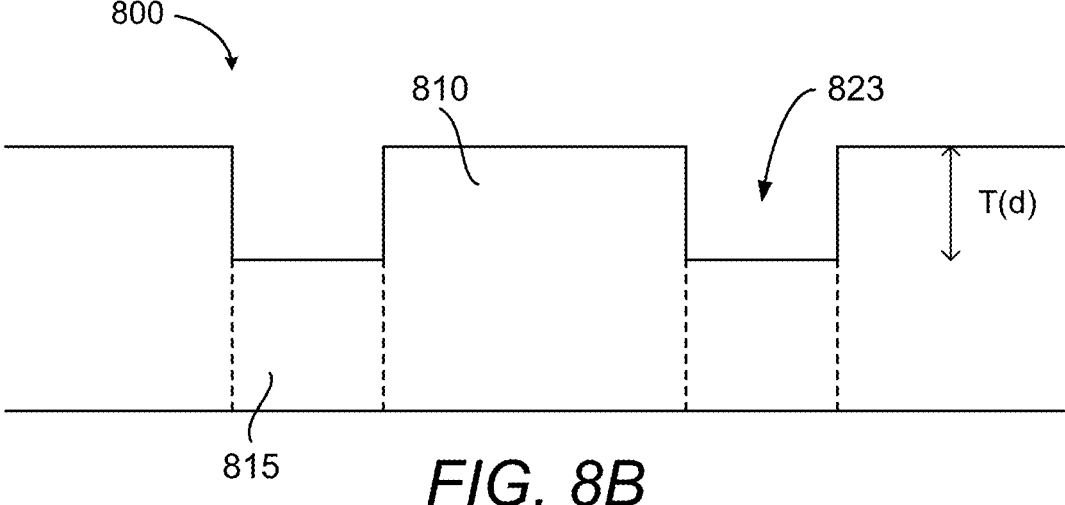

FIG. 8B illustrates a stage in which a trench 823 may be formed in the scribe region 815 on the frontside of the wafer 800. For example, the scribe region 815 may be frontside etched, e.g., by plasma, laser, etc. T(d) represents the depth of the trench. In an aspect, T(d) may be at least the thickness of the die 810. That is, the bottom of the trench may be at a height equal to or lower than the lower surface of the die 810. For typical Si dies, T(d) may be about 125 μm. For GaAs dies, T(d) may range between 150 μm-200 μm. In an aspect, the trench 823 may expose the sidewalls of the die 810. Note a trench 823 between adjacent dies 810 may expose sidewalls of both dies 810. When the wafer thickness T(w) is significantly greater than the etching depth T(d) (e.g., 700 μm vs. 175 μm), the act of etching the trench 823 is unlikely to result in chips and/or cracks developing.

Figure 8C:
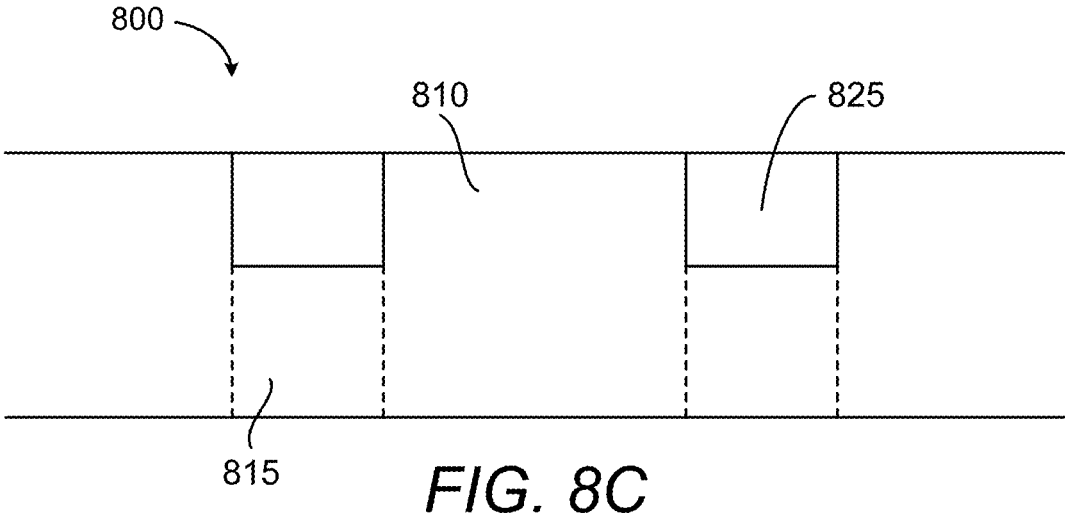

FIG. 8C illustrates a stage in which the trench 823 may be filled with a protection material 825. The protection material 825 may comprise one or more passivation materials (e.g., oxides, nitrides, etc.) or one or more metals (e.g., titanium (Ti), chromium (Cr), gold (Au), etc.) or any combination thereof. In this instance, the protection material 825 may fill the entirety of the trench 823. Note that the protection material 825 may cover the sidewalls of the die 810 as well as the bottom of the trench 823.

In an aspect, the upper surface of the protection material 825 may be planar with the upper surface of the die 810. For example, during the filling process, the trench 823 may be overfilled with the protection material 825 such that a portion of the protection material 825 is above the upper surface of the die 810 (not shown). In this instance, the protection material 825 may be planarized after filling the trench 823 such that upper surfaces of the protection material 825 and of the upper surface of the die 810 are planar.

Figure 8D:
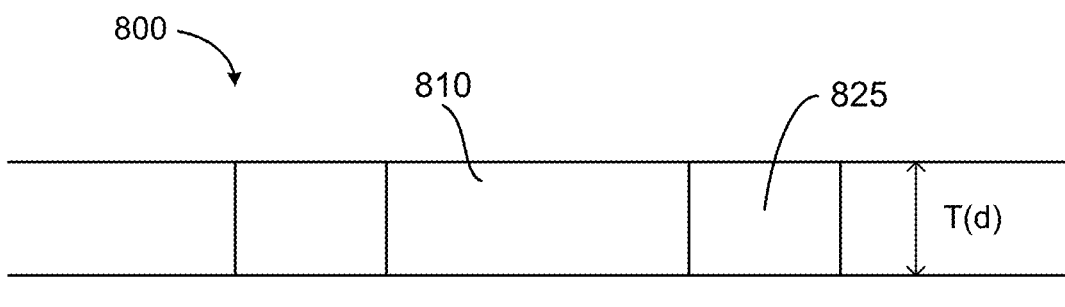

FIG. 8D illustrates a stage in which the wafer 800 may be backgrinded. That is, the backside of the wafer 800 may be grinded. The wafer 800 may be backgrinded until the thickness thereof reaches T(d), which is the thickness of the die 810. In an aspect, the protection material 825 may serve as a backgrind stop layer.

Figure 8E:
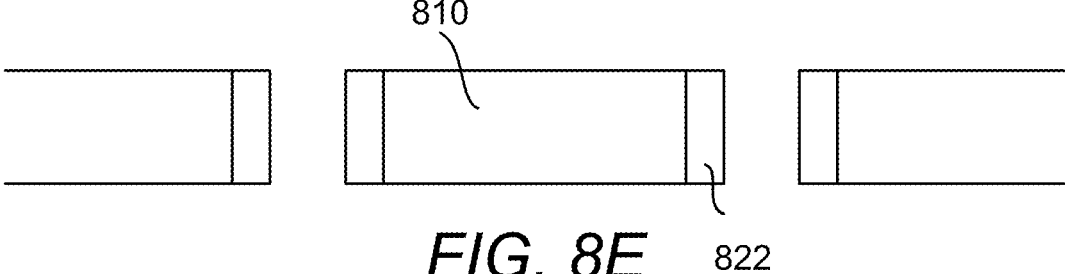

FIG. 8E illustrates a stage in which the wafer 800 may be diced into individual dies 810. A variety of dicing techniques may be used (e.g., mechanical, laser, plasma, etc.). Specifically, the protection material 825 may be diced. In an aspect, it may be preferred that the width W(s) of the scribe region be wider than the width of the dicing. Then when the dicing completes, not all of the protection material 825 is removed. The overhang—the remaining protection material 825—on both sides of the dicing becomes a part of the protection layer. In this instance, the remaining protection material 825 becomes the sidewall protection layer 822.

Note that the protection material 825 serves to protect the die 810 from chipping and cracking when the wafer 800 is diced. The die 810 may be brittle, and thus may be subject to chipping and/or cracking during the dicing process if it is not protected. In an aspect, the protection material 825 (and hence the protection layer resulting therefrom) may be a material that is less brittle than the dies 810 themselves. In particular, the protection material 825 may be less brittle than the edge portions and/or corner portions of the die 810. In this way, the protection material 825 may protect the die 810 during the dicing process and also may act to stop chips from propagating after dicing (e.g., during operation when the die 810 can be subjected to thermal and/or mechanical stresses).

FIGS. 9A-9E illustrate stages of fabricating a device in accordance with one or more aspects of the disclosure. In an aspect, the fabricated device may be similar the device 400 comprising the die 410 with the protection layer 420 (including sidewall protection layer 422) illustrated in FIGS. 4A-4B.

Figure 9A:
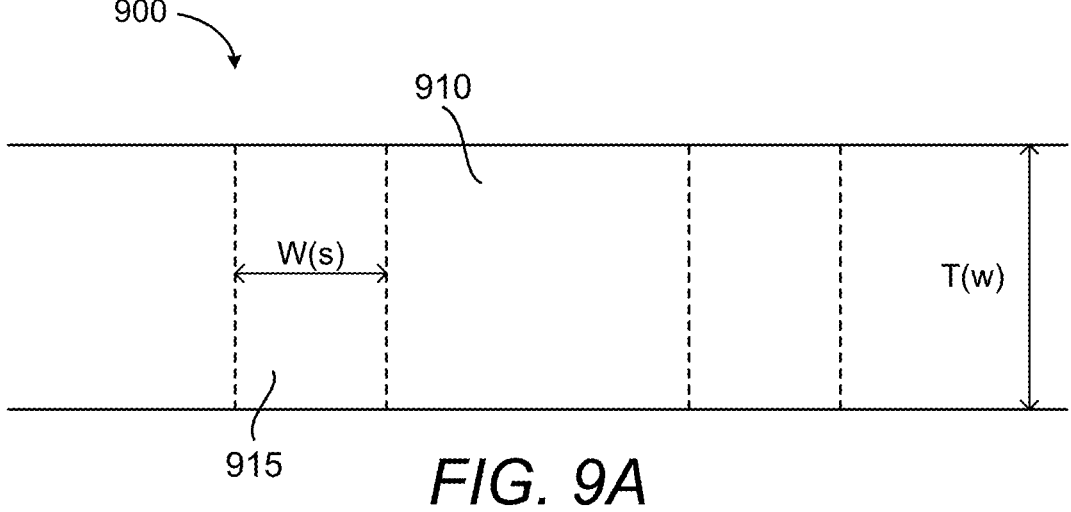
FIGS. 9A-9E illustrate stages of fabricating a device in accordance with one or more aspects of the disclosure.

FIG. 9A illustrates a stage after the frontend processing in which a wafer 900 comprising a plurality of dies 910 is produced. The dies 910 may be semiconductor dies. T(w) represents the thickness of the wafer 900. Scribe regions 915 may be between adjacent dies 910 in the wafer 900. FIG. 9A may be similar to FIG. 8A. Thus, discussion above with regard to FIG. 8A may be applicable to FIG. 9A.

Figure 9B:
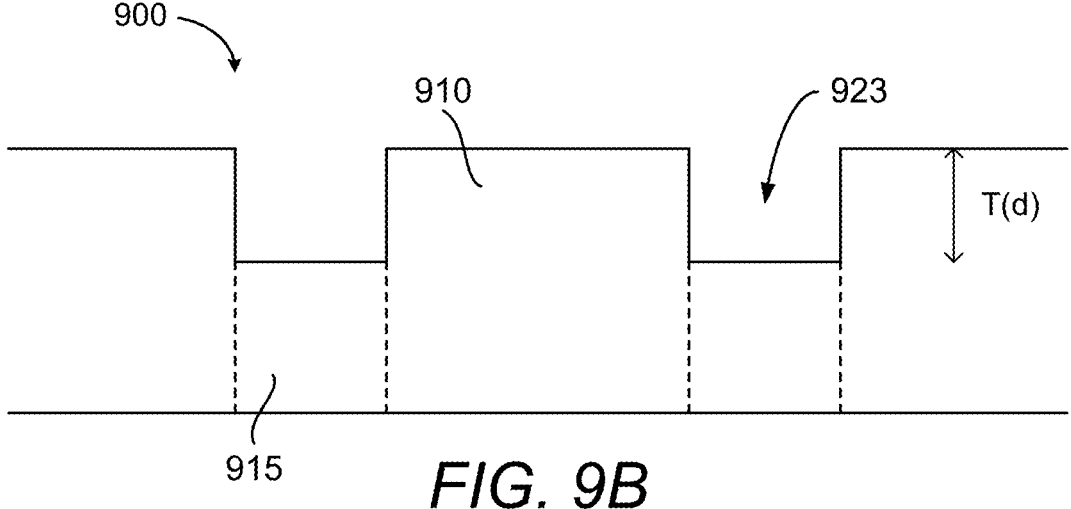

FIG. 9B illustrates a stage in which a trench 923 may be formed in the scribe region 915 on the frontside of the wafer 900, e.g., by frontside etching. T(d) represents the depth of the trench. In an aspect, T(d) may be at least the thickness of the die 910. The trench 923 may expose the sidewalls of the die 910. FIG. 9B may be similar to FIG. 8B. Thus, discussion above with regard to FIG. 8B may be applicable to FIG. 9B.

Figure 9C:
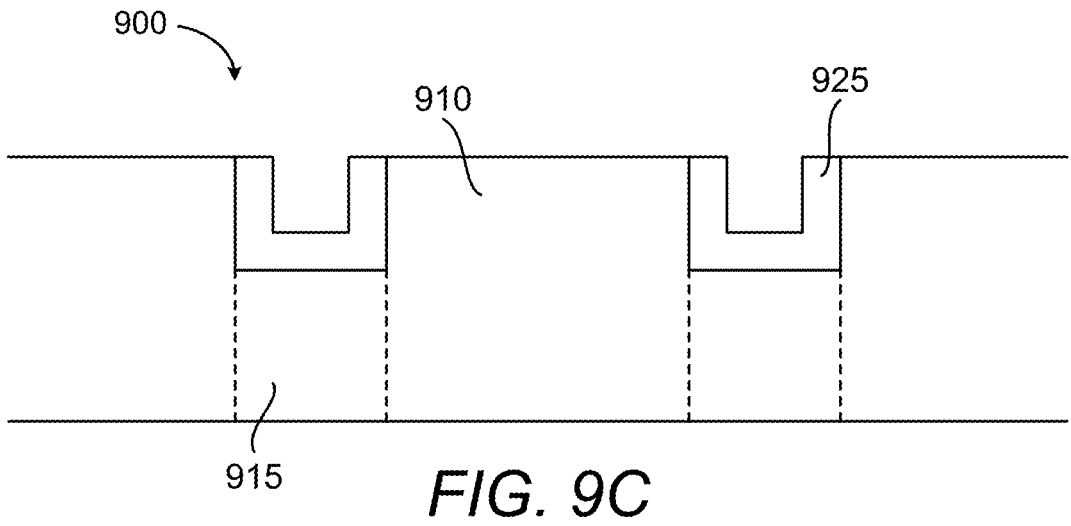

FIG. 9C illustrates a stage in which the trench 923 may be filled with a protection material 925. The protection material

925 may comprise one or more passivation materials (e.g., oxides, nitrides, etc.) or one or more metals (e.g., titanium (Ti), chromium (Cr), gold (Au), etc.) or any combination thereof. In this instance, the protection material 925 need not fill the entirety of the trench 923, which a departure from FIG. 8C. However, similar to FIG. 8C, the protection material 925 may cover the sidewalls of the die 910 as well as the bottom of the trench 923. Other aspects of the discussion above with regard to FIG. 8C may be applicable to FIG. 9C.

In an aspect, the upper surface of the protection material 925 may be planar with the upper surface of the die 910. For example, during the filling process, the trench 923 may be overfilled with the protection material 925 such that an outer portion of the protection material 925 is above the upper surface of the die 910 (not shown). In this instance, the protection material 925 may be planarized after filling the trench 923 such that the upper surfaces of the protection material 925 and of the die 910 are planar.

Figure 9D:
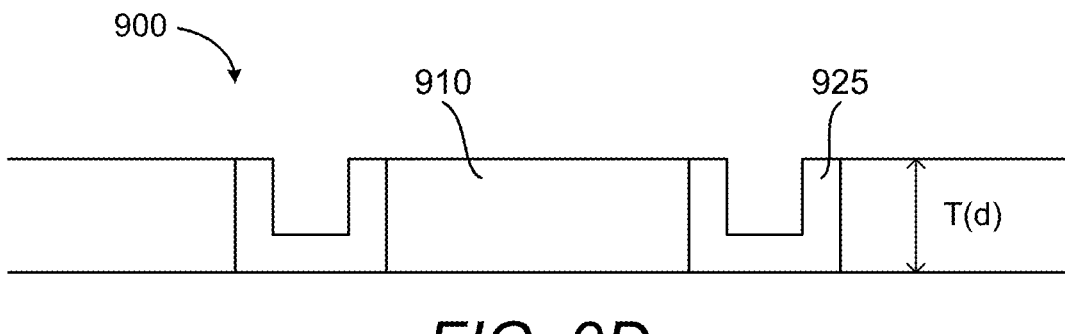

FIG. 9D illustrates a stage in which the wafer 900 may be backgrinded. The wafer 900 may be backgrinded until the thickness thereof reaches T(d), which is the thickness of the die 910. In an aspect, the protection material 925 may serve as a backgrind stop layer. FIG. 9D may be similar to FIG. 8D other than the shape of the protection material 925. Thus, discussion above with regard to FIG. 8D may be applicable to FIG. 9D.

Figure 9E:
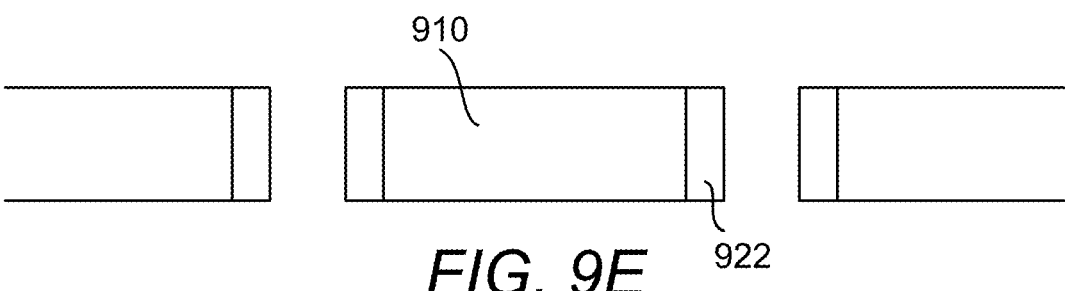

FIG. 9E illustrates a stage in which the wafer 900 may be diced into individual dies 910. Specifically, the protection material 925 may be diced. Again, it may be preferred that the width W(s) of the scribe region be wider than the width of the dicing. Then when the dicing completes, the middle of the "U' portion of the protection material 925 may be removed. However, the overhang—the remaining protection material 925—on both sides of the dicing may become a part of the protection layer such as the sidewall protection layer 922. FIG. 9E may be similar to FIG. 8E. Thus, discussion above with regard to FIG. 8E may be applicable to FIG. 9E.

The protection material 925 may serve to protect the die 910 from chipping and cracking when the wafer 900 is diced. In an aspect, the protection material 925 (and hence the protection layer resulting therefrom) may be a material that is less brittle than the dies 910 themselves. In particular, the protection material 925 may be less brittle than the edge portions and/or corner portions of the die 910 for the reasons discussed above.

FIGS. 10A-10E illustrate stages of fabricating a device in accordance with one or more aspects of the disclosure. In an aspect, the fabricated device may be similar the device 500 comprising the die 510 with the protection layer 520 (including sidewall protection layer 522 and upper edge protection layer 524) illustrated in FIGS. 5A-5C.

Figure 10A:
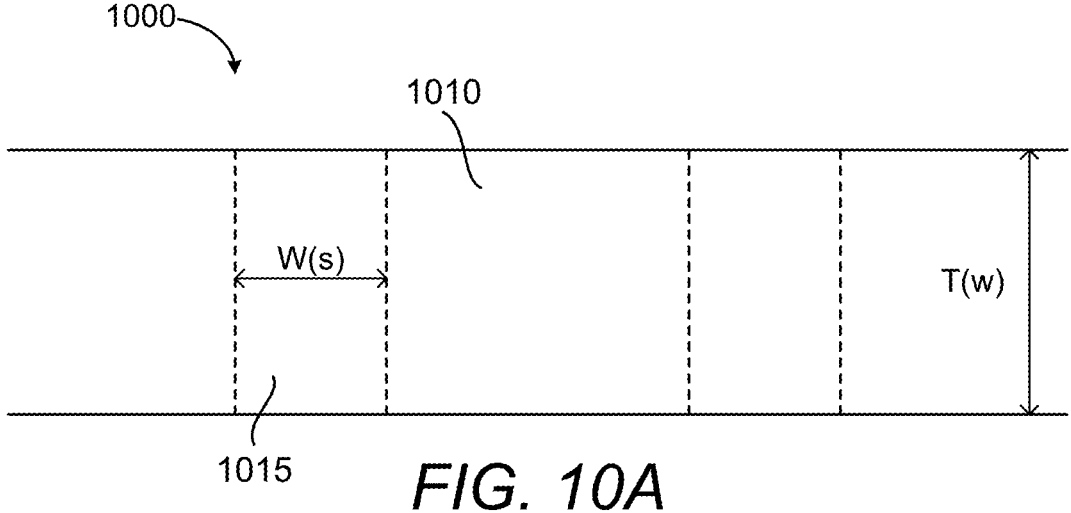
FIGS. 10A-10E illustrate stages of fabricating a device in accordance with one or more aspects of the disclosure.

FIG. 10A illustrates a stage after the frontend processing in which a wafer 1000 comprising a plurality of dies 1010 is produced. The dies 1010 may be semiconductor dies. T(w) represents the thickness of the wafer 1000. Scribe regions 1015 may be between adjacent dies 1010 in the wafer 1000. FIG. 10A may be similar to FIG. 8A. Thus, discussion above with regard to FIG. 8A may be applicable to FIG. 10A.

Figure 10B:
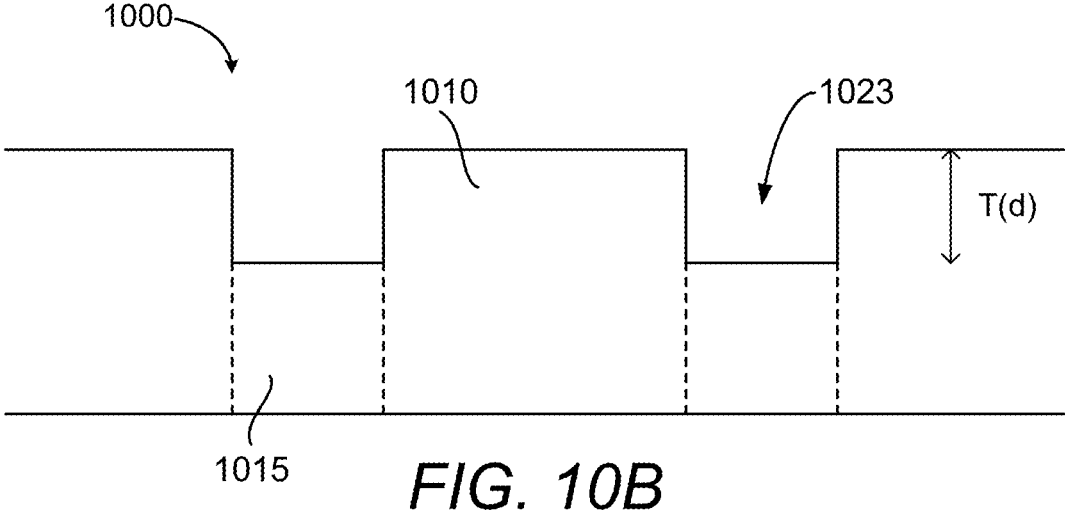

FIG. 10B illustrates a stage in which a trench 1023 may be formed in the scribe region 1015 on the frontside of the wafer 1000, e.g., by frontside etching. T(d) represents the depth of the trench. In an aspect, T(d) may be at least the thickness of the die 1010. The trench 1023 may expose the sidewalls of the die 1010. FIG. 10B may be similar to FIG. 8B. Thus, discussion above with regard to FIG. 8B may be applicable to FIG. 10B.

Figure 10C:
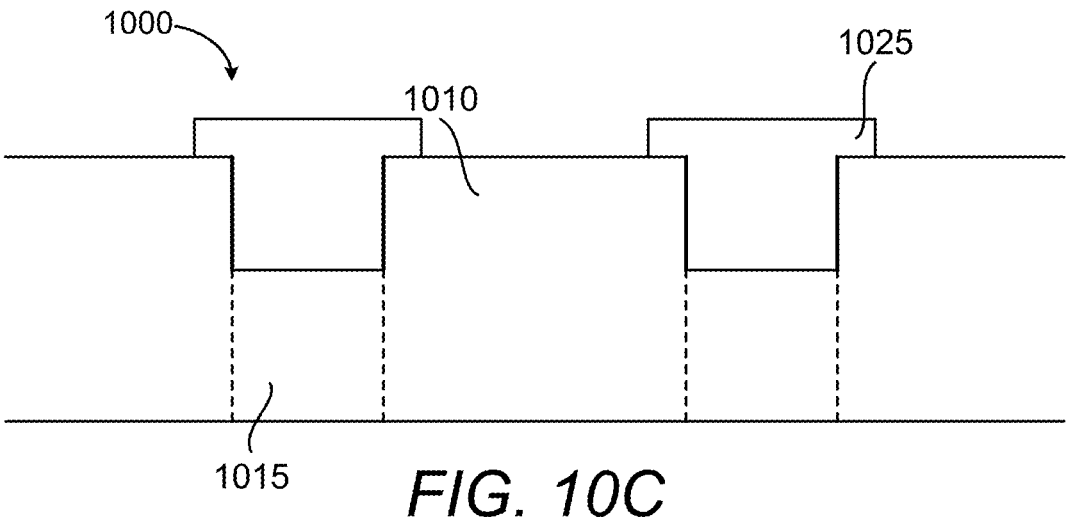

FIG. 10C illustrates a stage in which the trench 1023 may be filled with a protection material 1025. The protection material 1025 may comprise one or more passivation materials (e.g., oxides, nitrides, etc.) or one or more metals (e.g., titanium (Ti), chromium (Cr), gold (Au), etc.) or any combination thereof.

In this instance, the trench 1023 may be overfilled with the protection material 1025 on purpose such that the protection material 1025 is mushroom-shaped (also referred to as T-shaped) in which a portion of the protection material 1025 is above the upper surface of the die 1010.

Figure 10D:
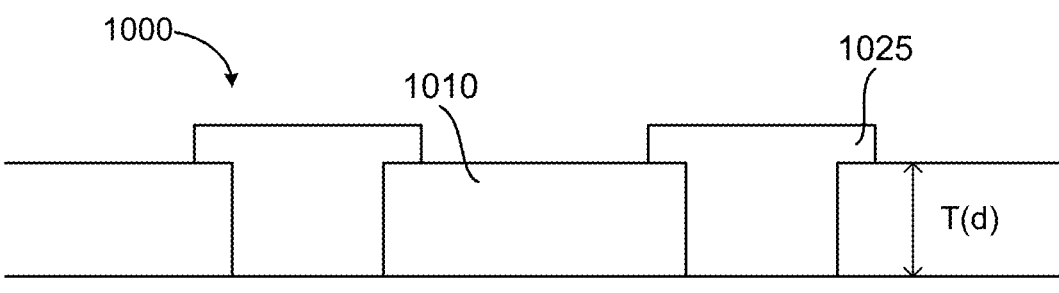

FIG. 10D illustrates a stage in which the wafer 1000 may be backgrinded. The wafer 1000 may be backgrinded until the thickness thereof reaches T(d), which is the thickness of the die 1010. In an aspect, the protection material 1025 may serve as a backgrind stop layer. FIG. 10D may be similar to FIG. 8D other than the shape of the protection material 1025. Thus, discussion above with regard to FIG. 8D may be applicable to FIG. 10D.

Figure 10E:
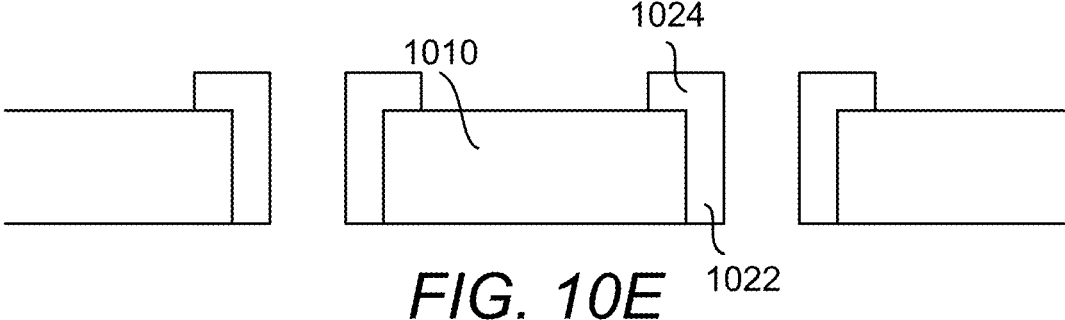

FIG. 10E illustrates a stage in which the wafer 1000 may be diced into individual dies 1010. Specifically, the protection material 1025 may be diced. Again, it may be preferred that the width W(s) of the scribe region be wider than the width of the dicing. Then when the dicing completes, the middle of the protection material 1025 may be removed. However, the overhang—the remaining protection material 1025—on both sides of the dicing may become a part of the protection layer including the sidewall protection layer 1022 and the upper edge protection layer 1024. FIG. 10E may be similar to FIG. 8E other than the shape of the resulting protection layer. Thus, discussion above with regard to FIG. 8E may be applicable to FIG. 10E.

FIGS. 11A-11F illustrate stages of fabricating a device in accordance with one or more aspects of the disclosure. In an aspect, the fabricated device may be similar the device 600 comprising the die 610 with the protection layer 620 (including sidewall protection layer 622 and lower surface protection layer 626) illustrated in FIGS. 6A-6C.

Figures 11A, 11B, 11C:
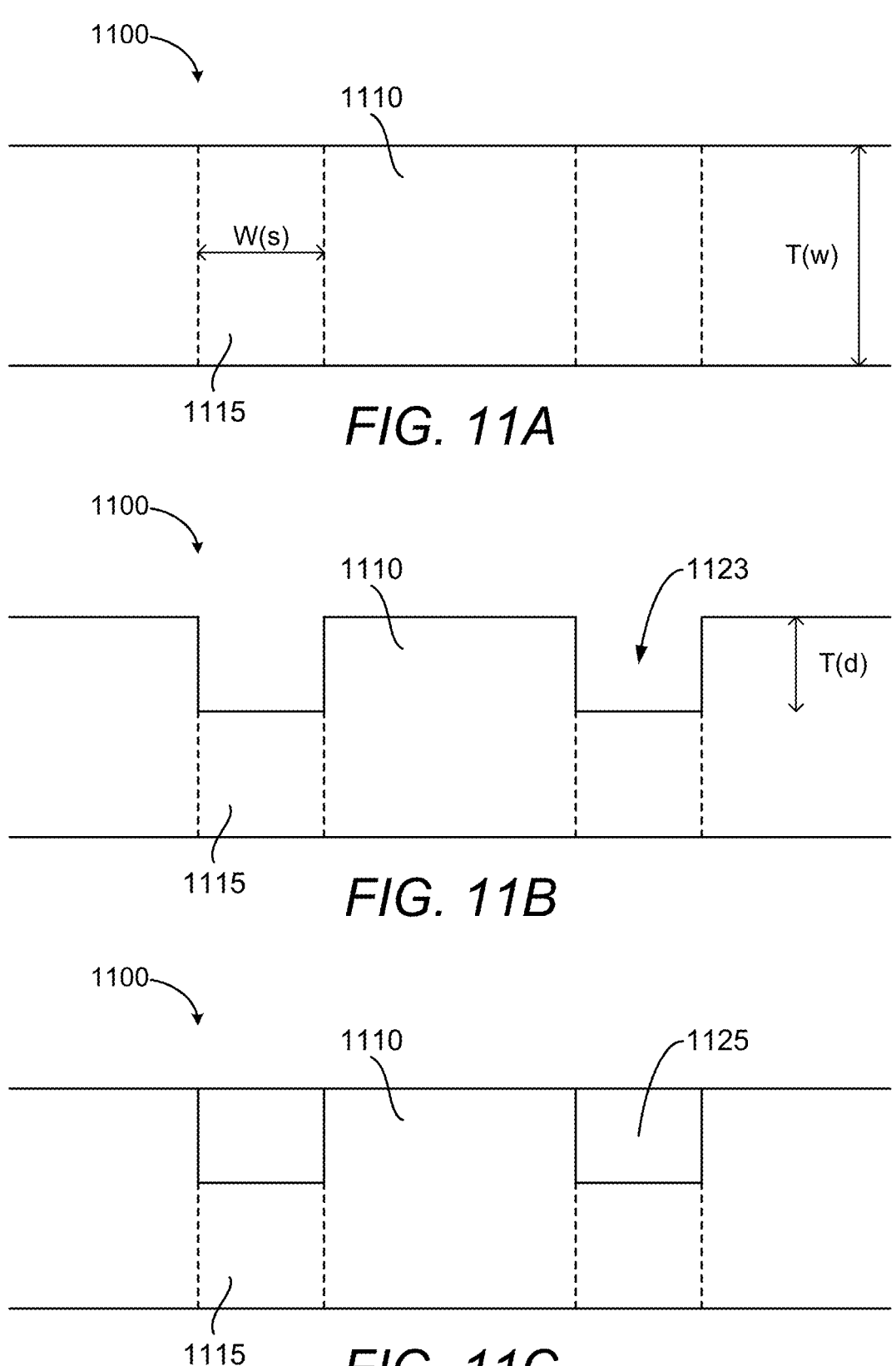
FIGS. 11A-11F illustrate stages of fabricating a device in accordance with one or more aspects of the disclosure.

FIG. 11A illustrates a stage after the frontend processing in which a wafer 1100 comprising a plurality of dies 1110 is produced. The dies 1110 may be semiconductor dies. T(w) represents the thickness of the wafer 1100. Scribe regions 1115 may be between adjacent dies 1110 in the wafer 1100. FIG. 11A may be similar to FIG. 8A. Thus, discussion above with regard to FIG. 8A may be applicable to FIG. 11A.

FIG. 11B illustrates a stage in which a trench 1123 may be formed in the scribe region 1115 on the frontside of the wafer 1100, e.g., by frontside etching. T(d) represents the depth of the trench. In an aspect, T(d) may be at least the thickness of the die 1110. The trench 1123 may expose the sidewalls of the die 1110. FIG. 11B may be similar to FIG. 8B. Thus, discussion above with regard to FIG. 8B may be applicable to FIG. 11B.

FIG. 11C illustrates a stage in which the trench 1123 may be filled with a protection material 1125. The protection material 1125 may comprise one or more passivation materials (e.g., oxides, nitrides, etc.) or one or more metals (e.g., titanium (Ti), chromium (Cr), gold (Au), etc.) or any combination thereof. FIG. 11C may be similar to FIG. 8C. Thus, discussion above with regard to FIG. 8C may be applicable to FIG. 11C.

In an aspect, the upper surface of the protection material 1125 may be planar with the upper surface of the die 1110. For example, during the filling process, the trench 1123 may be overfilled with the protection material 1125 such that an outer portion of the protection material 1125 is above the upper surface of the die 1110 (not shown). The protection material 1125 may be planarized after filling the trench 1123 such that the upper surfaces of the protection material 1125 and of the die 1110 are planar.

Figure 11D:
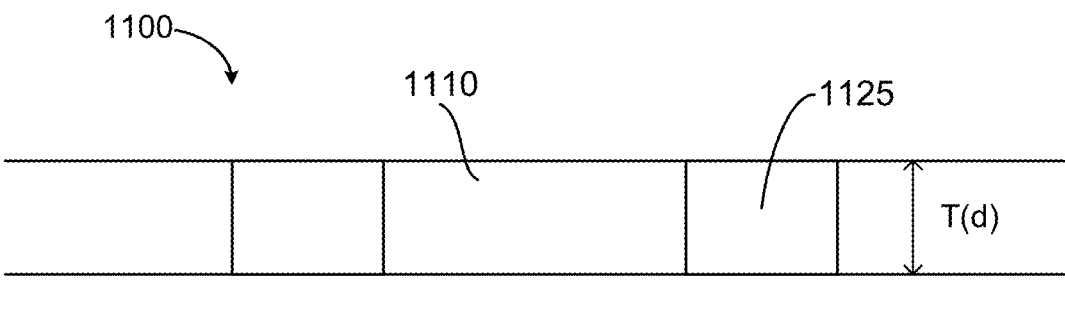

FIG. 11D illustrates a stage in which the wafer 1100 may be backgrinded. The wafer 1100 may be backgrinded until the thickness thereof reaches T(d), which is the thickness of the die 1110. In an aspect, the protection material 1125 may serve as a backgrind stop layer. FIG. 11D may be similar to FIG. 8D. Thus, discussion above with regard to FIG. 8D may be applicable to FIG. 11D.

Figure 11E:
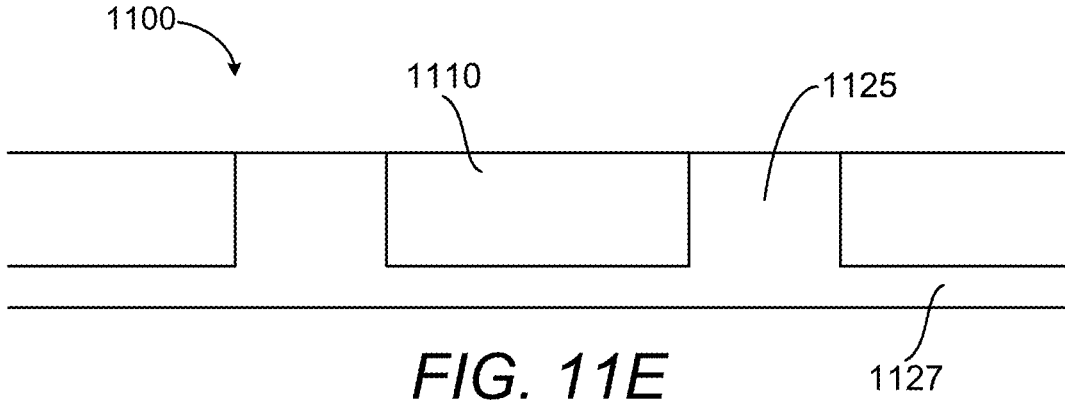

FIG. 11E illustrates a stage in which additional protection material 1127 may be applied on the lower surface of the wafer 1100 after backgrinding the wafer 1100. The protection material 1125 and the additional protection material 1127 may be the same. Alternatively, they may be different. In one example, the additional protection material 1127 may be a metal to function as a back via contact when the wafer 1100 is diced into individual dies.

Figure 11F:
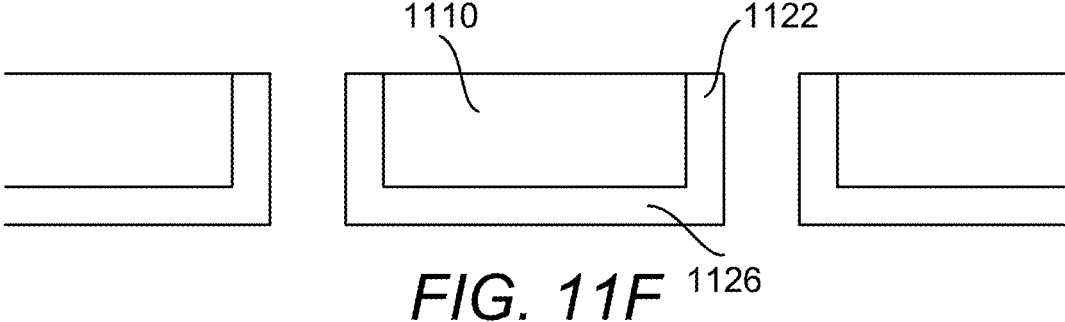

FIG. 11F illustrates a stage in which the wafer 1100 may be diced into individual dies 1110. Specifically, the protection material 1125 and the additional protection material 1127 may be diced. Again, it may be preferred that the width W(s) of the scribe region be wider than the width of the dicing. Then when the dicing completes, the middle of the protection material 1125 may be removed. However, the overhang—the remaining protection material 1125—on both sides of the dicing may become a part of the protection layer including the sidewall protection layer 1122 and the lower surface protection layer 1126. FIG. 11F may be similar to FIG. 8E other than the shape of the resulting protection layer. Thus, discussion above with regard to FIG. 8E may be applicable to FIG. 11F.

FIGS. 12A-12E illustrate stages of fabricating a device in accordance with one or more aspects of the disclosure. In an aspect, the fabricated device may be similar the device 700 comprising the die 710 with the protection layer 720 (including upper sidewall protection layer 728 and lower sidewall protection layer 729) illustrated in FIGS. 7A-7C.

Figure 12A:
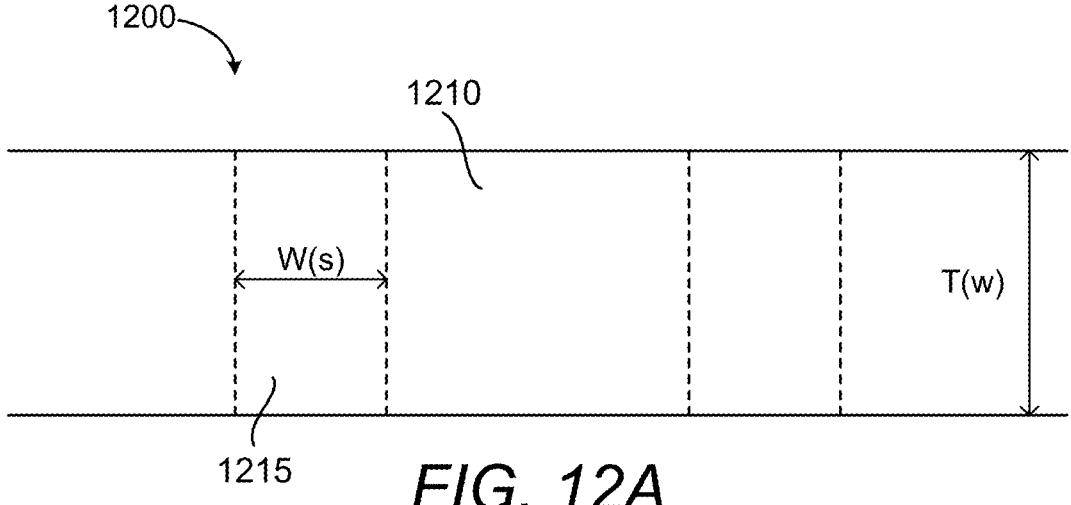
FIGS. 12A-12E illustrate stages of fabricating a device in accordance with one or more aspects of the disclosure.

FIG. 12A illustrates a stage after the frontend processing in which a wafer 1200 comprising a plurality of dies 1210 is produced. The dies 1210 may be semiconductor dies. T(w) represents the thickness of the wafer 1200. Scribe regions 1215 may be between adjacent dies 1210 in the wafer 1200. FIG. 12A may be similar to FIG. 8A. Thus, discussion above with regard to FIG. 8A may be applicable to FIG. 12A.

Figure 12B:
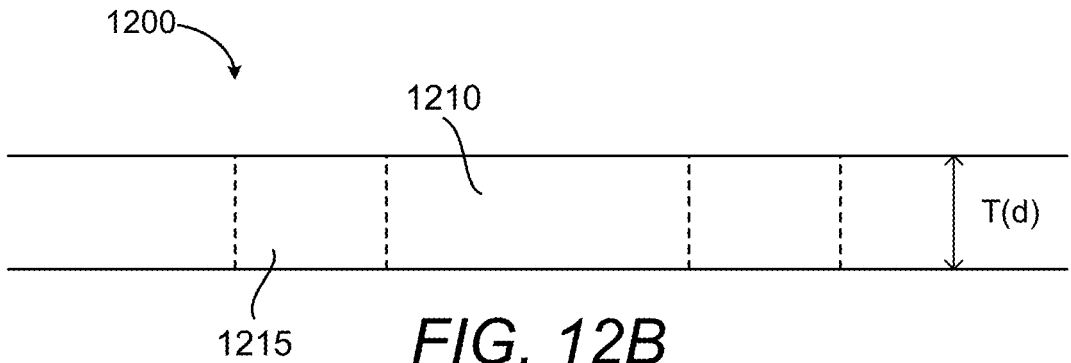

FIG. 12B illustrates a stage in which the wafer 1200 may be backgrinded. The wafer 1200 may be backgrinded until the thickness thereof reaches T(d), which is the thickness of the die 1210.

Figure 12C:
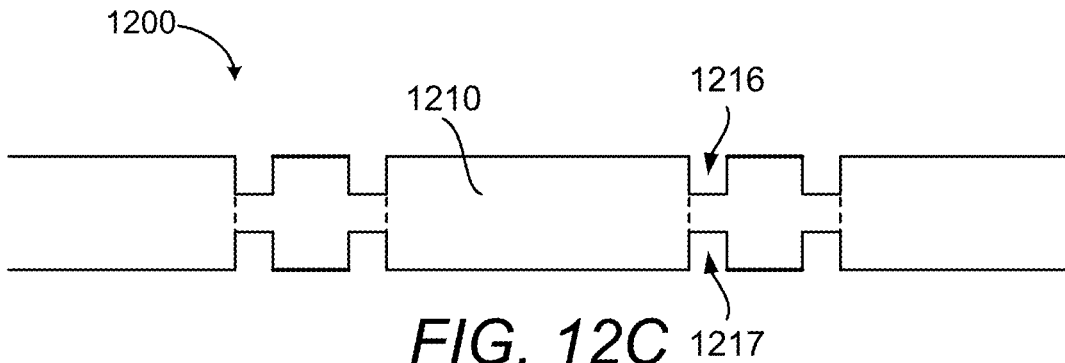

FIG. 12C illustrates a stage in which an upper edge groove 1216 and a lower edge groove 1217 may be formed. The upper edge groove 1216 may be formed in the scribe region 1215 on the frontside of the wafer 1200, e.g., by frontside etching. The upper edge groove 1216 may expose upper portions of all sidewalls of the die 1210. The lower edge groove 1217 may be formed in the scribe region 1215 on the backside of the wafer 1200, e.g., by backside etching. The lower edge groove 1217 may expose lower portions of all sidewalls of the die 1210.

In an aspect, the upper surface of the first protection material 1218 may be planar with the upper surface of the die 1210. For example, during the filling process, the upper edge groove 1216 may be overfilled with the first protection material 1218 such that a portion of the first protection material 1218 is above the upper surface of the die 1210 (not shown). The first protection material 1218 may be planarized after filling the upper edge groove 1216 such that the upper surfaces of first protection material 1218 and of the die 1210 are planar.

Alternatively or in addition thereto, the lower surface of the second protection material 1219 may be planar with the lower surface of the die 1210. For example, during the filling process, the lower edge groove 1217 may be overfilled with the second protection material 1219 such that a portion of the second protection material 1219 is below the lower surface of the die 1210 (not shown). The second protection material 1219 may be planarized after filling the lower edge groove 1217 such that the lower surfaces of second protection material 1219 and of the die 1210 are planar.

Figure 12D:
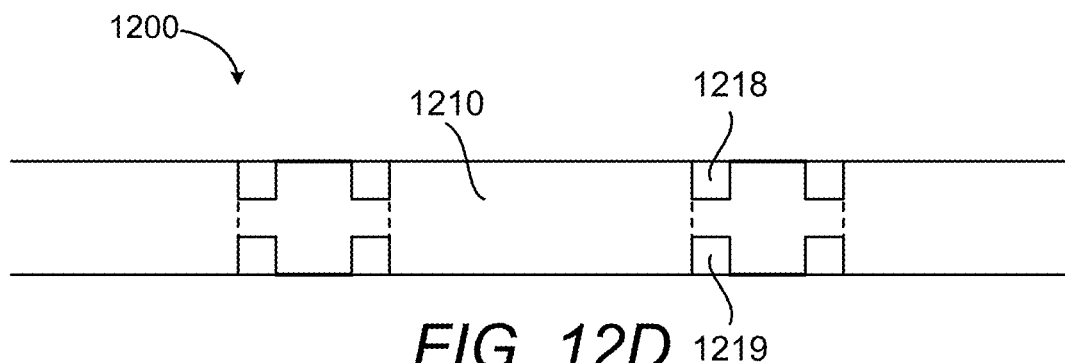

FIG. 12D illustrates a stage in which the upper edge groove 1216 may be filled with a first protection material 1218, and the lower edge groove 1217 may be filled with a second protection material 1219. The first protection material 1218 may comprise one or more passivation materials (e.g., oxides, nitrides, etc.) or one or more metals (e.g., titanium (Ti), chromium (Cr), gold (Au), etc.) or any combination thereof. The second protection material 1219 may comprise one or more passivation materials (e.g., oxides, nitrides, etc.) or one or more metals (e.g., titanium (Ti), chromium (Cr), gold (Au), etc.) or any combination thereof. The first and second protection materials 1218, 1219 may be the same material. Alternatively, they may be different materials.

Figure 12E:
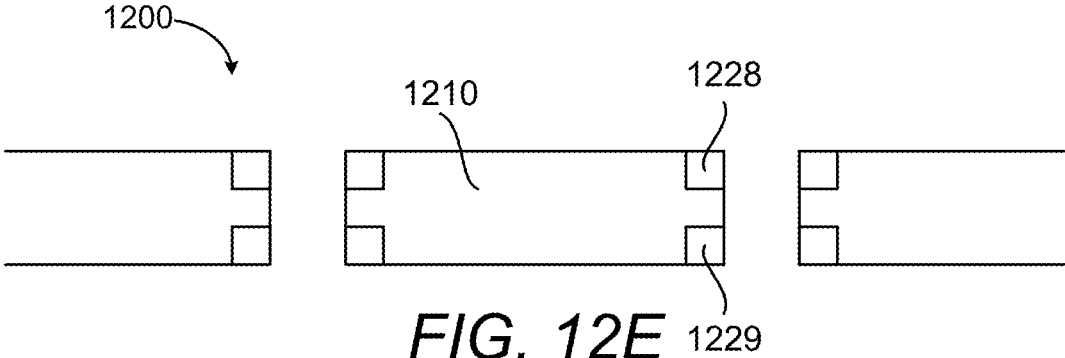

FIG. 12E illustrates a stage in which the wafer 1200 may be diced into individual dies 1210. In this instance the scribe region material maybe diced. It may be preferred that the width W(s) of the scribe region be wider than the width of the dicing. Then when the dicing completes, the scribe region material may be removed, but the first and second protection materials 1218, 1219 may remain to form the upper and lower sidewall protection layers 1228, 1229.

FIGS. 13A-13E illustrate stages of fabricating a device in accordance with one or more aspects of the disclosure. In an aspect, the fabricated device may be similar the device 400 comprising the die 410 with the protection layer 420 (including sidewall protection layer 422) illustrated in FIGS. 4A-4B.

Figure 13A:
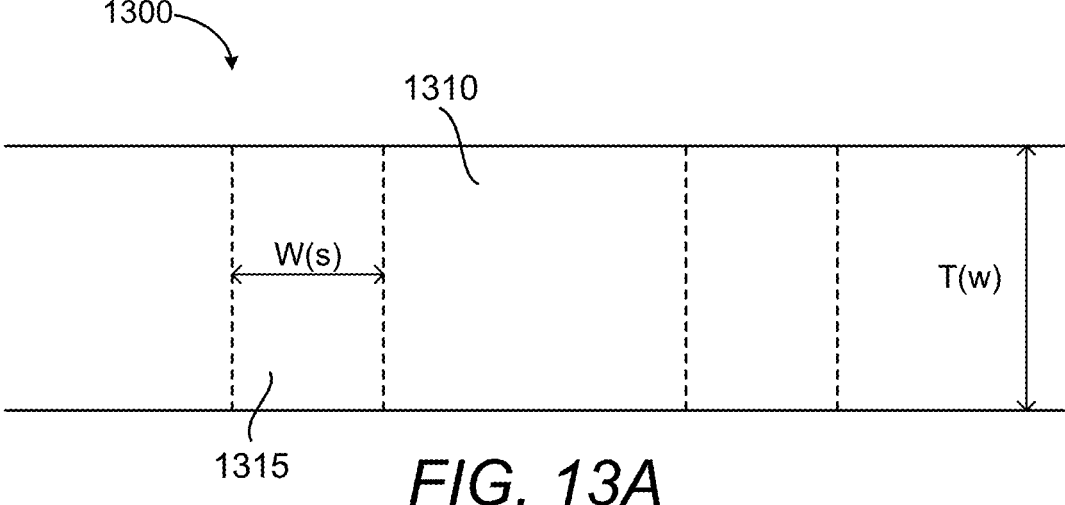
FIGS. 13A-13E illustrate stages of fabricating a device in accordance with one or more aspects of the disclosure.

FIG. 13A illustrates a stage after the frontend processing in which a wafer 1300 comprising a plurality of dies 1310 is produced. The dies 1310 may be semiconductor dies. T(w) represents the thickness of the wafer 1300. Scribe regions 1315 may be between adjacent dies 1310 in the wafer 1300. FIG. 13A may be similar to FIG. 8A. Thus, discussion above with regard to FIG. 8A may be applicable to FIG. 13A.

Figure 13B:
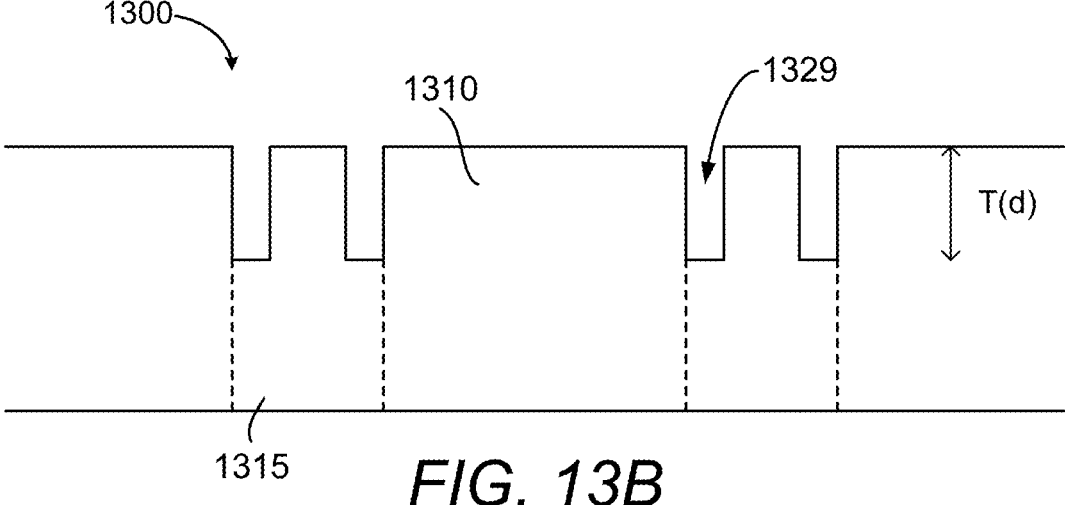

FIG. 13B illustrates a stage in which an edge groove 1329 may be formed in the scribe region 1315 on the frontside of the wafer 1300, e.g., by frontside etching. T(d) represents the depth of the trench. In an aspect, T(d) may be at least the thickness of the die 1310. The edge groove 1329 may be adjacent to each die 1310 and expose the sidewalls of the die 1310. The width of each edge groove 1329 may be less than the width W(s) of the scribe region 1315.

Figure 13C:
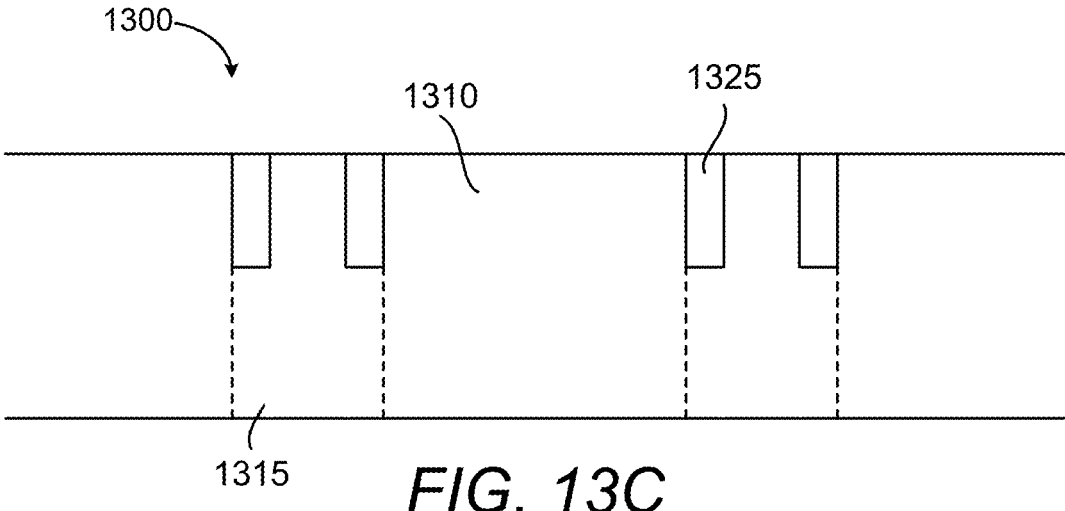

FIG. 13C illustrates a stage in which the edge groove 1329 may be filled with a protection material 1325. The protection material 1325 may comprise one or more passivation materials (e.g., oxides, nitrides, etc.) or one or more metals (e.g., titanium (Ti), chromium (Cr), gold (Au), etc.) or any combination thereof. In this instance, the protection material 1325 may fill the entirety of each edge groove 1329. The protection material 1325 may cover the sidewalls of the die 1310.

In an aspect, the upper surface of the protection material 1325 may be planar with the upper surface of the die 1310.

For example, during the filling process, the edge groove 1329 may be overfilled with the protection material 1325 such that a portion of the protection material 1325 is above the upper surface of the die 1310 (not shown). In this instance, the protection material 1325 may be planarized after filling the edge groove 1329 such that the upper surfaces of the protection material 1325 and of the die 1310 are planar.

Figure 13D:
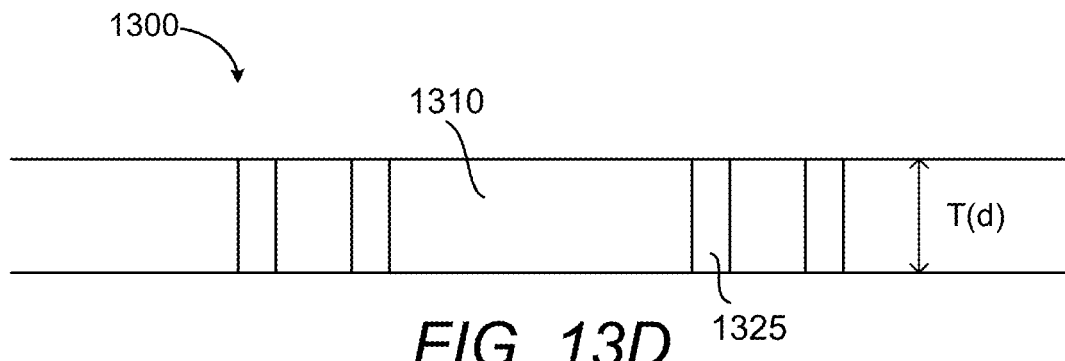

FIG. 13D illustrates a stage in which the wafer 1300 may be backgrinded. The wafer 1300 may be backgrinded until the thickness thereof reaches T(d), which is the thickness of the die 1310. In an aspect, the protection material 1325 may serve as a backgrind stop layer. FIG. 13D may be similar to FIG. 8D other than the shape of the protection material 1325. Thus, discussion above with regard to FIG. 8D may be applicable to FIG. 13D.

Figure 13E:
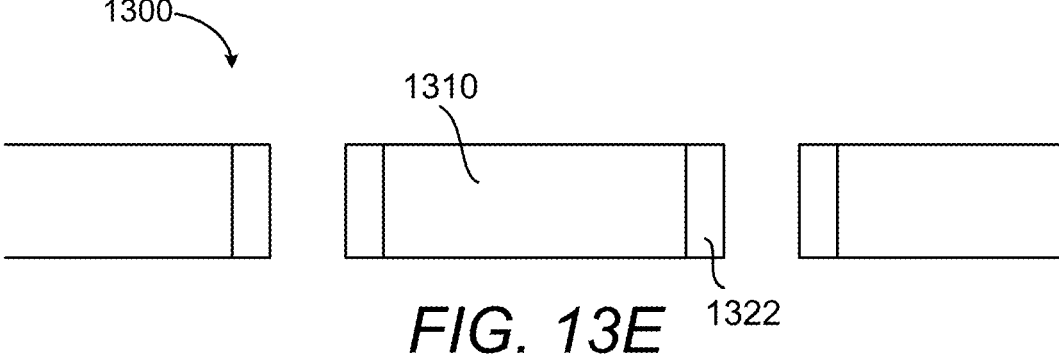

FIG. 13E illustrates a stage in which the wafer 1300 may be diced into individual dies 1310. Specifically, the protection material 1325 may be diced. Again, it may be preferred that the width W(s) of the scribe region be wider than the width of the dicing. Then when the dicing completes, the scribe region material may be removed, but the protection material 1325 may remain to form the sidewall protection layer 1322. FIG. 13E may be similar to FIG. 8E. Thus, discussion above with regard to FIG. 8E may be applicable to FIG. 13E.

Figure 14:
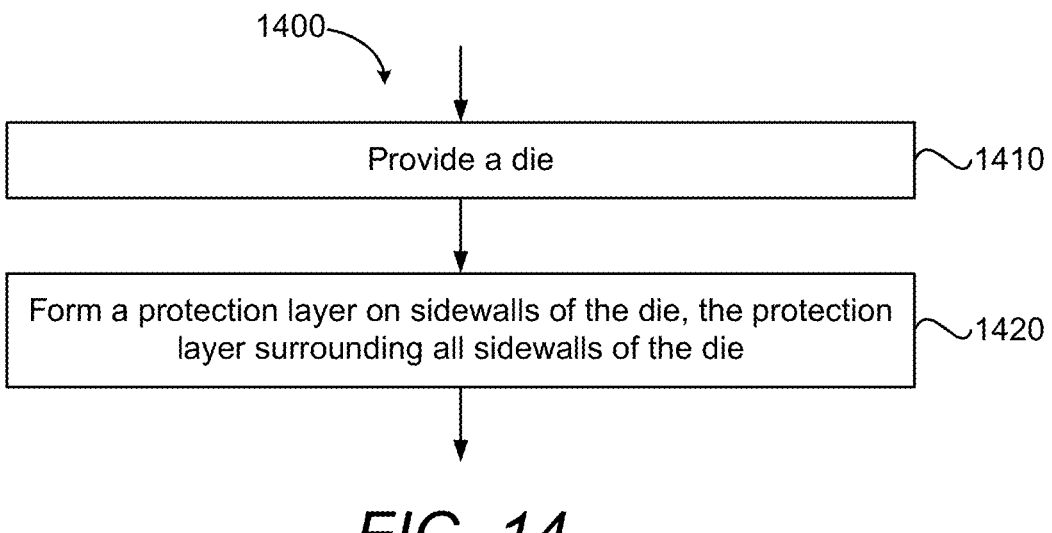
FIGS. 14-16 illustrate flow charts of an example method of manufacturing a device in accordance with at one or more aspects of the disclosure.

FIG. 14 illustrates a flow chart of an example method 1400 of fabricating a device (e.g., device 300, 400, 500, 600, 700, etc.) in accordance with at one or more aspects of the disclosure. In block 1410, a die (e.g., die 310, 410, 510, 610, 710) may be provided. In an aspect, the method 1400 may be viewed as being a part of a backend process, i.e., a process performed after the wafer is fabricated.

In block 1420, a protection layer (e.g., protection layer 320, 420, 520, 620, 720) may be formed on sidewalls of the die. The protection layer may surround all sidewalls of the die. The protection layer may be formed from various materials (e.g., one or more oxides, one or more nitrides, one or more metals, or any combination thereof).

Figure 15:
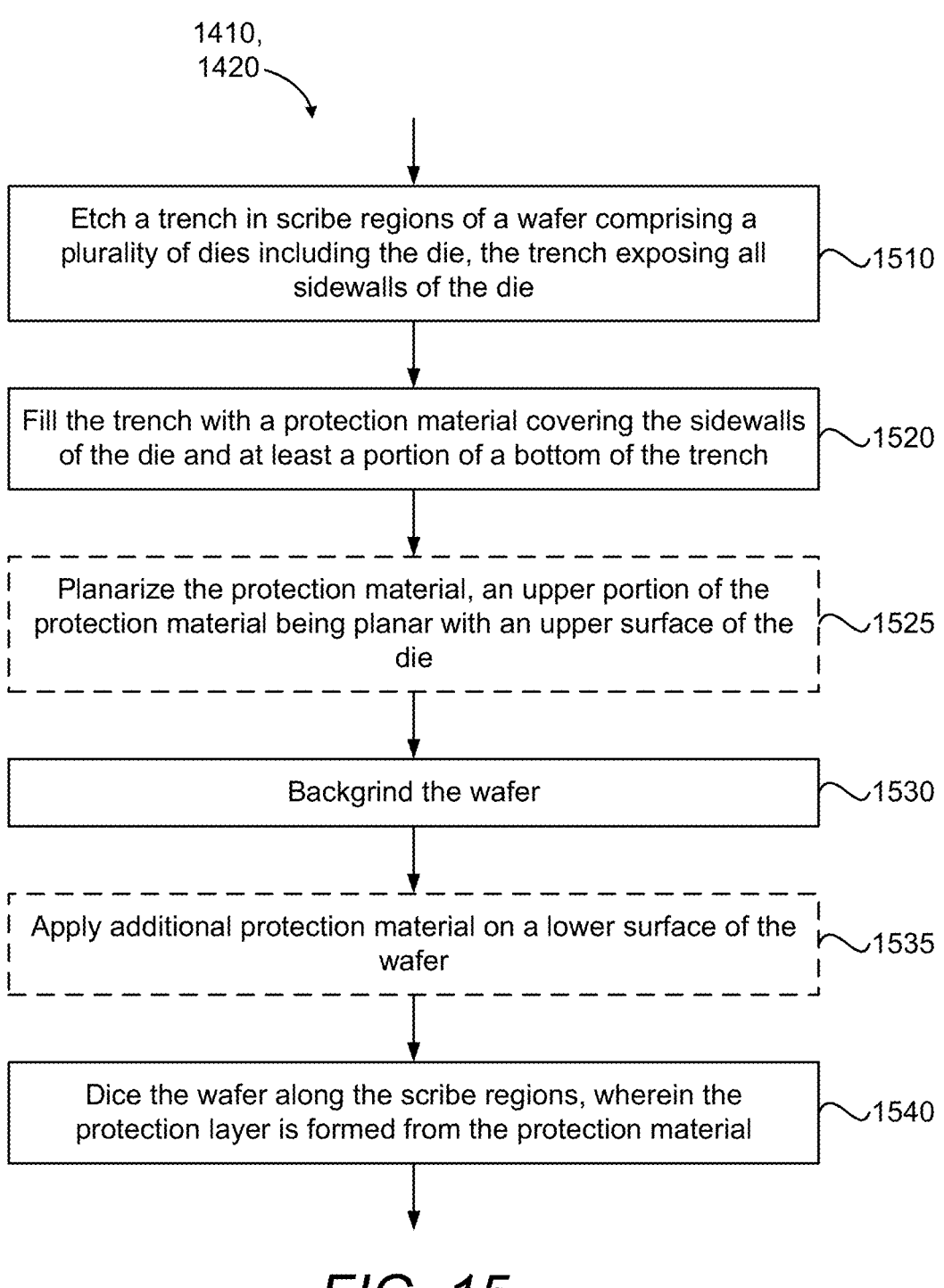

FIG. 15 illustrates a flow chart of an example process to implement blocks 1410 and 1420. In an aspect, the flow chart of FIG. 15 may be applicable at least to the stages illustrated in FIGS. 8A-8E, 9A-9E, 10A-10E, 11A-11D, 13A-13E to form devices 400, 500, 600.

In block 1510, a trench may be etched in scribe regions (e.g., scribe regions 815, 915, 1015, 1115, 1315) of a wafer (e.g., wafer 800, 900, 1000, 1100, 1300) (e.g., see FIGS. 8B, 9B, 10B, 11B, 13B). The trench (e.g., trench 823, 923, 1023, 1123, edge groove 1323) may expose all sidewalls of the die (e.g., die 810, 910, 1010, 1110, 1310). A depth of the trench may be equal to or greater than a thickness of the die T(d).

In block 1520, the trench may be filled with a protection material (e.g., see FIGS. 8C, 9C, 10C, 11C, 13C). The protection material (e.g., protection material 825, 925, 1025, 1125, 1325) may cover the sidewalls of the die. The protection material may also cover at least a portion of the bottom of the trench. In an aspect, the trench may be completely filled with the protection material (e.g., see FIGS. 8C, 11C, 13C). In another aspect, the trench may be filled such that a cross section of the protection material is U shaped to cover the sidewalls of the die and the bottom of the trench (e.g., see FIG. 9C). In yet another aspect, the trench may be overfilled to be above the upper surface of the die. For example, the trench may be overfilled with the protection material, e.g., in a mushroom shape over the upper surface of the die (e.g., see FIG. 10C).

In block 1525, the protection material may be planarized such that the upper surface of the protection material is planar with an upper surface of the die (e.g., see FIGS. 8C, 9C, 11C, 13C). For example, if the trench is overfilled, then the excess protection material may be planarized.

Note that block 1525 is optional as indicated with a dashed rectangle. That is, block 1525 need not be performed. For example, the trench may be purposely overfilled with the protection material and left alone without planarizing (e.g., see FIG. 10C).

In block 1530, the wafer may be backgrinded (e.g., see FIGS. 8D, 9D, 10D, 11D, 13D). The backgrinding may stop when the thickness of the wafer is thinned to T(d), i.e., to the thickness of the die. In an aspect, if the depth of the trench is T(d), then the protection material may be utilized as a backgrind stop layer. In an aspect, block 1530 may be performed after block 1525 or after 1520 (if no planarizing takes place).

In block 1535, additional protection material (e.g., additional protection material 1127) may be applied on the lower surface of the wafer (e.g., see FIG. 11E). Block 1535 may also be optional (as indicated by the dashed rectangle). While not shown, it should be noted that block 1535 may be performed with other processes (e.g., between stages of FIGS. 9D and 9E, between stages of FIGS. 10D and 10E, between stages of FIGS. 13D and 13E). If performed, block 1535 may take place after block 1530.

In block 1540, the wafer may be diced along the scribe regions (e.g., see FIGS. 8E, 9E, 10E, 11F, 13E). After the dicing, the protection layer (e.g., protection layer 420, 520, 620) may be formed to protect the die. For example, various combinations of the sidewall protection layer (e.g., sidewall protection layer 822, 922, 1022, 1122, 1322), the upper edge protection layer (e.g., upper edge protection layer 1024), and the lower surface protection layer (e.g., lower surface protection layer 1126) may be formed after the dicing.

Figure 16:
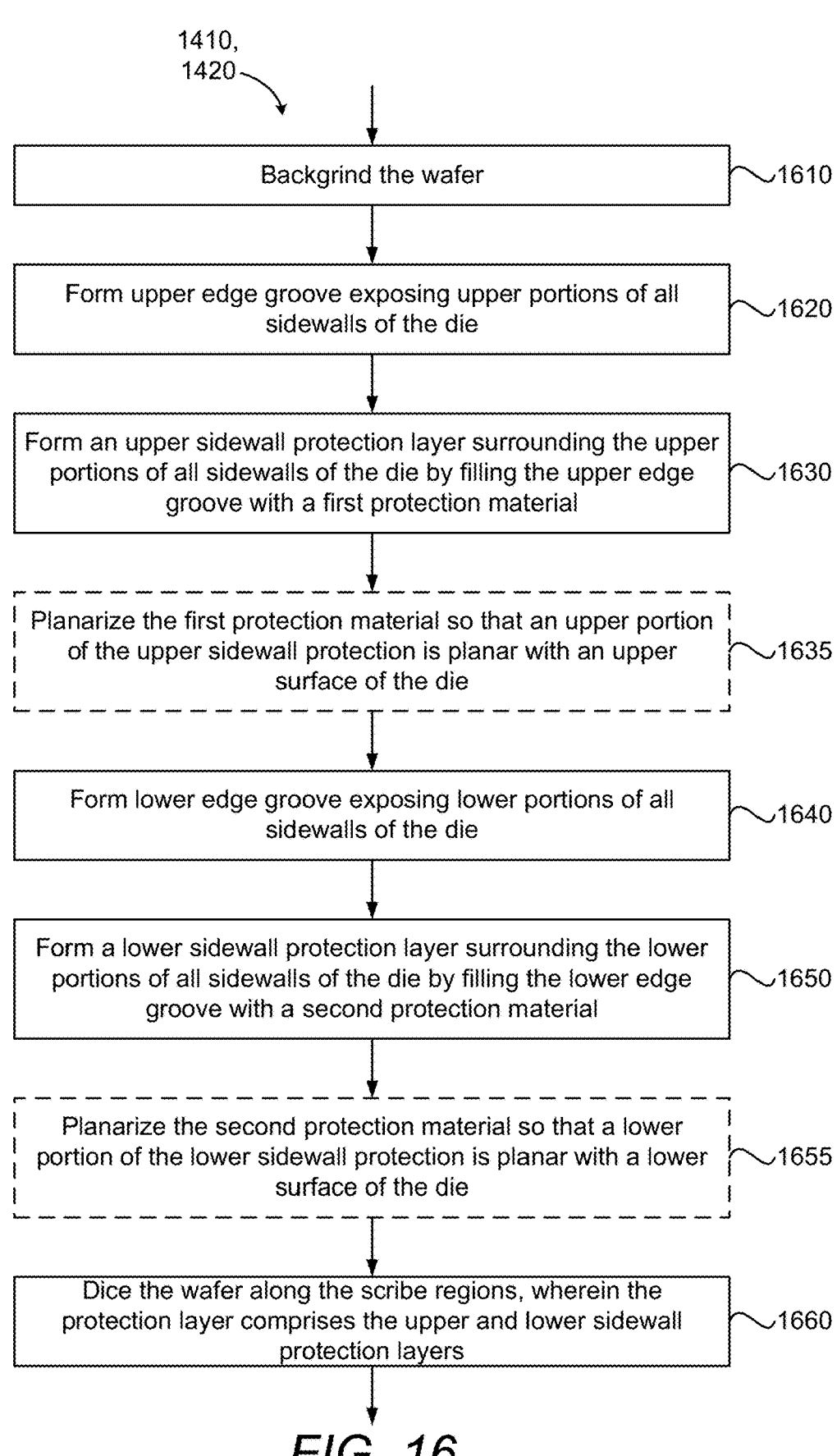

FIG. 16 illustrates a flow chart of another example process to implement blocks 1410 and 1420. In an aspect, the flow chart of FIG. 16 may be applicable at least to the stages illustrated in FIGS. 12A-12E to form device 700.

In block 1610, the wafer may be backgrinded (e.g., see FIG. 12B). The backgrinding may stop when the thickness of the wafer (e.g., wafer 1200) is thinned to T(d), i.e., to the thickness of the die (e.g., die 1210).

In block 1620, an upper edge groove may be formed (e.g., see FIG. 12C). The upper edge groove (e.g., upper edge groove 1216) may expose upper portions of all sidewalls of the die.

In block 1630, an upper sidewall protection layer (e.g., upper sidewall protection layer 1228) may be formed by filling the upper edge groove with a first protection material (e.g., first protection material 1218) (e.g., see FIG. 12D). The upper sidewall protection layer may surround upper portions of all sidewalls of the die.

In block 1635, the first protection material may be planarized after filling the upper edge groove such that the upper surface of the first protection material is planar with an upper surface of the die (e.g., see FIG. 12D). For example, if the upper edge groove is overfilled, then the excess first protection material may be planarized.

Note that block 1625 is optional as indicated with a dashed rectangle. That is, block 1625 need not be performed. For example, the upper edge groove may be purposely overfilled with the first protection material and left alone without planarizing (not shown). In this way, an upper edge protection layer (similar to the upper edge protection layer 1024 of FIG. 10) may be formed.

In block 1640, a lower edge groove may be formed (e.g., see FIG. 12C). The lower edge groove (e.g., lower edge groove 1217) may expose lower portions of all sidewalls of the die. In an aspect, block 1640 may be after block 1610.

In block 1650, a lower sidewall protection layer (e.g., lower sidewall protection layer 1229) may be formed by filling the lower edge groove with a second protection material (e.g., second protection material 1219) (e.g., see FIG. 12D). The lower sidewall protection layer may surround lower portions of all sidewalls of the die. In an aspect, the first and second protection materials may be the same. Alternatively, they may be different.

In block 1655, the second protection material may be planarized after filling the lower edge groove such that the lower surface of the second protection material is planar with a lower surface of the die (e.g., see FIG. 12D). For example, if the lower edge groove is overfilled, then the excess second protection material may be planarized.

Note that block 1655 is optional as indicated with a dashed rectangle. That is, block 1655 need not be performed. For example, additional protection material (similar to the additional protection material 1127) may be applied on the lower surface of the wafer to create a lower surface protection layer (similar to the lower surface protection layer 1126) (not shown). In this instance, the excess additional protection material need not be removed.

In block 1660, the wafer may be diced along the scribe regions (e.g., see FIG. 12E). After the dicing, the protection layer may be formed to protect the die. For example, various combinations of the sidewall protection layer (e.g., sidewall protection layer 822, 922, 1022, 1122, 1322), the upper edge protection layer (e.g., upper edge protection layer 1024), and the lower surface protection layer (e.g., lower surface protection layer 1126) may be formed after the dicing.

After the dicing, the protection layer (e.g., protection layer 720) may be formed to protect the die. For example, the upper sidewall protection layer (e.g., upper sidewall protection layer 1228) and the lower sidewall protection layer (e.g., lower sidewall protection layer 1229) may be formed after the dicing.

Figure 17:
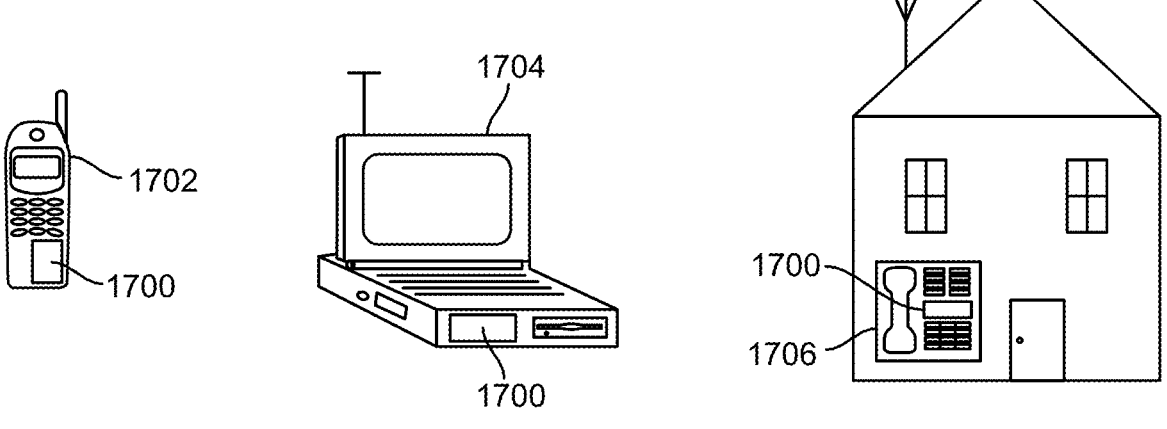
FIG. 17 illustrates various electronic devices which may utilize one or more aspects of the disclosure.

FIG. 17 illustrates various electronic devices 1700 that may be integrated with any of the aforementioned devices in accordance with various aspects of the disclosure. For example, a mobile phone device 1702, a laptop computer device 1704, and a fixed location terminal device 1706 may each be considered generally user equipment (UE) and may include one or more devices (e.g., devices 300, 400, 500, 600, 700) as described herein. The devices 1702, 1704, 1706 illustrated in FIG. 17 are merely exemplary. Other electronic devices may also include the described devices including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A device comprising: a die; and a protection layer formed on sidewalls of the die, the protection layer surrounding all sidewalls of the die.

Clause 2: The device of clause 1, wherein a material of the protection layer is less brittle than a material of an edge portion of the die.

Clause 3: The device of any of clauses 1-2, wherein the protection layer is formed from one or more oxides, one or more nitrides, one or more metals, or any combination thereof.

Clause 4: The device of any of clauses 1-3, wherein the protection layer comprises: a sidewall protection layer surrounding all sidewalls of the die, the sidewall protection layer covering an entirety of a vertical height of the sidewalls of the die.

Clause 5: The device of clause 4, wherein the protection layer further comprises: an upper edge protection layer formed on one or more upper edge portions of the die and on an upper surface of the sidewall protection layer.

Clause 6: The device of clause 5, wherein the upper edge protection layer is formed on all upper edge portions of the die, all upper edges and corners of the die being covered by the protection layer.

Clause 7: The device of any of clauses 5-6, wherein the sidewall protection layer and the upper edge protection layer are formed from a same material.

Clause 8: The device of any of clauses 1-7, wherein the protection layer further comprises: a lower surface protection layer formed on a lower surface of the die and on a lower surface of the sidewall protection layer.

Clause 9: The device of clause 8, wherein the lower surface protection layer covers an entirety of the lower surface of the die, all lower edges and lower corners of the die being covered by the protection layer.

Clause 10: The device of any of clauses 8-9, wherein the sidewall protection layer and the lower surface protection layer are formed from a same material.

Clause 11: The device of any of clauses 8-10, wherein the lower surface protection layer is formed from one or more metals and configured as a back via contact.

Clause 12: The device of any of clauses 1-3, wherein the protection layer comprises: an upper sidewall protection layer surrounding upper portions of all sidewalls of the die; and a lower sidewall protection layer surrounding lower portions of all sidewalls of the die.

Clause 13: The device of clause 12, wherein an upper surface of the upper sidewall protection layer is planar with an upper surface of the die, or wherein a lower surface of the lower sidewall protection layer is planar with a lower surface of the die, or both.

Clause 14: The device of any of clauses 12-13, wherein the upper sidewall protection layer and the lower sidewall protection layer are formed from a same material.

Clause 15: The device of any of clauses 1-14, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 16: A method of fabricating a device, the method comprising: providing a die; and forming a protection layer on sidewalls of the die, the protection layer surrounding all sidewalls of the die.

Clause 17: The method of clause 16, wherein the protection layer is formed from one or more oxides, one or more nitrides, one or more metals, or any combination thereof.

Clause 18: The method of any of clauses 16-17, wherein providing the die and forming the protection layer comprises: etching a trench in scribe regions of a wafer comprising a plurality of dies including the die, the trench exposing all sidewalls of the die; filling the trench with a protection material covering the sidewalls of the die and at least a portion of a bottom of the trench; backgrinding the wafer subsequent to filling the trench; and dicing the wafer along the scribe regions subsequent to backgrinding the wafer, wherein the protection layer is formed from the protection material.

Clause 19: The method of clause 18, wherein a depth of the trench is equal to or greater than a thickness of the die.

Clause 20: The method of any of clauses 18-19, wherein the backgrinding the wafer stops when a thickness of the wafer reaches the thickness of the die.

Clause 21: The method of any of clauses 18-20, wherein the protection material is used as a backgrind stop layer when backgrinding the wafer.

Clause 22: The method of any of clauses 18-21, wherein providing the die and forming the protection layer further comprises: planarizing the protection material, an upper surface of the protection material being planar with an upper surface of the die, wherein the protection material is planarized subsequent to filling the trench and prior to dicing the wafer, and wherein a sidewall protection layer of the protection layer is formed after dicing the wafer, the sidewall protection layer surrounding all sidewalls of the die and covering an entirety of a vertical height of the sidewalls of the die.

Clause 23: The method of any of clauses 18-22, wherein the trench is completely filled with the protection material.

Clause 24: The method of any of clauses 18-22, wherein the trench is filled such that a cross section of the protection material is U shaped to cover the sidewalls of the die and a bottom of the trench.

Clause 25: The method of any of clauses 18-21, wherein the trench is overfilled in a mushroom shape above an upper surface of the die such that after dicing the wafer, the protection layer comprises: a sidewall protection layer surrounding all sidewalls of the die and covering an entirety of a vertical height of the sidewalls of the die; and an upper edge protection layer formed on all upper edge portions of the die and on an upper surface of the sidewall protection layer, wherein all upper edges and corners of the die are covered by the protection layer.

Clause 26: The method of any of clauses 18-25, wherein providing the die and forming the protection layer further comprises: applying additional protection material on a lower surface of the wafer subsequent to backgrinding the wafer and prior to dicing the wafer, wherein after the wafer is diced, the protection layer comprises: a sidewall protection layer surrounding all sidewalls of the die and covering an entirety of a vertical height of the sidewalls of the die; and a lower surface protection layer formed on a lower surface of the die and on a lower surface of the sidewall protection layer, the lower surface protection layer covering an entirety of the lower surface of the die.

Clause 27: The method of any of clauses 18-26, wherein the trench is an edge groove adjacent to the sidewalls of the die, a width of the edge groove being less than a width of the scribe region.

Clause 28: The method of any of clauses 16-27, wherein providing the die and forming the protection layer comprises: backgrinding the wafer; and forming an upper edge groove exposing upper portions of all sidewalls of the die; forming an upper sidewall protection layer surrounding upper portions of all sidewalls of the die by filling the upper edge groove with a first protection material; forming a lower edge groove subsequent to backgrinding the wafer, the lower edge groove exposing upper portions of all sidewalls of the die; forming a lower sidewall protection layer surrounding lower portions of all sidewalls of the die by filling the lower edge groove with a second protection material; dicing the wafer along the scribe regions subsequent to forming the lower sidewall protection layer, wherein the protection layer comprises the upper and lower sidewall protection layers.

Clause 29: The method of clause 28, wherein an upper surface of the upper sidewall protection layer is planar with an upper surface of the die, or wherein a lower surface of the lower sidewall protection layer is planar with a lower surface of the die, or both.

Clause 30: The method of any of clauses 28-29, wherein the first and second protection materials are the same.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device comprising:
a die; and
a protection layer formed on sidewalls of the die, the protection layer surrounding all sidewalls of the die,
wherein the protection layer comprises:
a sidewall protection layer surrounding all sidewalls of the die, the sidewall protection layer covering an entirety of a vertical height of the sidewalls of the die;
an upper edge protection layer formed on one or more upper edge portions of the die and on an upper surface of the sidewall protection layer, wherein the upper edge protection layer is formed on all upper edge portions of the die, all upper edges and corners of the die being covered by the protection layer, and
wherein a center portion of the die is not covered by the upper edge protection layer.

2. The device of claim 1, wherein a material of the protection layer is less brittle than a material of an edge portion of the die.

3. The device of claim 1, wherein the protection layer is formed from one or more oxides, one or more nitrides, one or more metals, or any combination thereof.

4. The device of claim 1, wherein the sidewall protection layer and the upper edge protection layer are formed from a same material.

5. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

6. A device comprising:
a die; and
a protection layer formed on sidewalls of the die, the protection layer surrounding all sidewalls of the die,
wherein the protection layer comprises:
a sidewall protection layer surrounding all sidewalls of the die, the sidewall protection layer covering an entirety of a vertical height of the sidewalls of the die; and
a lower surface protection layer formed on a lower surface of the die and on a lower surface of the sidewall protection layer,
wherein the protection layer is formed from one or more oxides, one or more nitrides, or any combination thereof,
wherein the lower surface protection layer covers an entirety of the lower surface of the die, all lower edges and lower corners of the die being covered by the protection layer, and
wherein the sidewall protection layer and the lower surface protection layer are formed from a same material.

7. The device of claim 6, wherein a material of the protection layer is less brittle than a material of an edge portion of the die.

8. The device of claim 6, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

9. A device comprising:
a die; and
a protection layer formed on sidewalls of the die, the protection layer surrounding all sidewalls of the die,
wherein the protection layer comprises:
an upper sidewall protection layer surrounding upper portions of all sidewalls of the die; and
a lower sidewall protection layer surrounding lower portions of all sidewalls of the die, and

wherein middle portions of all sidewalls of the die are not
covered by either the upper sidewall protection layer or
by the lower sidewall protection layer.

10. The device of claim 9, wherein an upper surface of the upper sidewall protection
layer is planar with an upper surface of the die, or wherein a lower surface of the lower sidewall protection
layer is planar with a lower surface of the die, or both.

11. The device of claim 9, wherein the upper sidewall
protection layer and the lower sidewall protection layer are
formed from a same material.

12. The device of claim 9, wherein a material of the
protection layer is less brittle than a material of an edge
portion of the die.

13. The device of claim 9, wherein the protection layer is
formed from one or more oxides, one or more nitrides, one
or more metals, or any combination thereof.

14. The device of claim 9, wherein the device is incor-
porated into an apparatus selected from the group consisting
of a music player, a video player, an entertainment unit, a
navigation device, a communications device, a mobile
device, a mobile phone, a smartphone, a personal digital
assistant, a fixed location terminal, a tablet computer, a
computer, a wearable device, an Internet of things (IoT)
device, a laptop computer, a server, and a device in an
automotive vehicle.

\* \* \* \* \*